United States Patent [19]

Forsyth et al.

[11] Patent Number: 4,969,169
[45] Date of Patent: Nov. 6, 1990

[54] X-RAY LITHOGRAPHY SYSTEM
[75] Inventor: James M. Forsyth, Macedon, N.Y.
[73] Assignee: Hampshire Instruments, Inc., Rochester, N.Y.
[21] Appl. No.: 201,689
[22] Filed: Jun. 2, 1988

Related U.S. Application Data

[63] Continuation of Ser. No. 852,108, Apr. 15, 1986, abandoned.
[51] Int. Cl.$^5$ ............................................. G21K 5/00
[52] U.S. Cl. ..................................... 378/34; 378/119; 250/491.1
[58] Field of Search ............... 250/442.1, 444.1, 440.1, 250/492.2, 491.1, 505.1; 219/121 LT, 121 LP, 121 LR, 121 L, 121 LM, 121 P; 414/416, 744 B, 331, 283; 378/34, 35, 122, 119

[56] References Cited

U.S. PATENT DOCUMENTS

| 4,683,365 | 7/1987 | Kasher et al. | 219/121.73 |
| 4,695,698 | 9/1987 | Mayor et al. | 219/121.6 |
| 4,734,558 | 3/1988 | Nakano et al. | 350/334 |
| 4,746,256 | 5/1988 | Boyle et al. | 414/331 |

Primary Examiner—Craig E. Church
Assistant Examiner—John C. Freeman
Attorney, Agent, or Firm—Harry W. Barron

[57] ABSTRACT

An x-ray lithography system is disclosed in which x-rays are generated by directing a high energy laser beam against a metal target to form an x-ray emitting plasma. The x-rays from the plasma are then directed through a mask towards a resist covered wafer to cause a patterned exposure on the wafer resist coating. The mask, the portion of the target which the laser beam strikes and the portion of the water to be exposed are all within an evacuated chamber. The laser, prior to entering the chamber, is split into two separate beams, each of which are focused and directed through a window in the side of the chamber towards the same spot on the target. Apparatus, including an air bearing, seal and positioner, is provided to move the target at periodic intervals. Similar apparatus is provided to move the wafer from exposure section to exposure section. The laser beam system includes a face pumped laser beam amplifier and unidirectional beam expanders to allow the maximum energy to be transferred to the laser beam by the amplifier. A series of two or more laser pulses are provided in order to maximize the energy obtained from the laser amplifier. A magnet and a membrane shield are also provided to prevent high energy particles and dust contaminants from the plasma from effecting the lithography process. A materials handling device is provided for moving wafers, targets and masks and an alignment system operating within the evacuated chamber, positions of the wafer with respect to the mask prior to the exposure thereof.

53 Claims, 17 Drawing Sheets

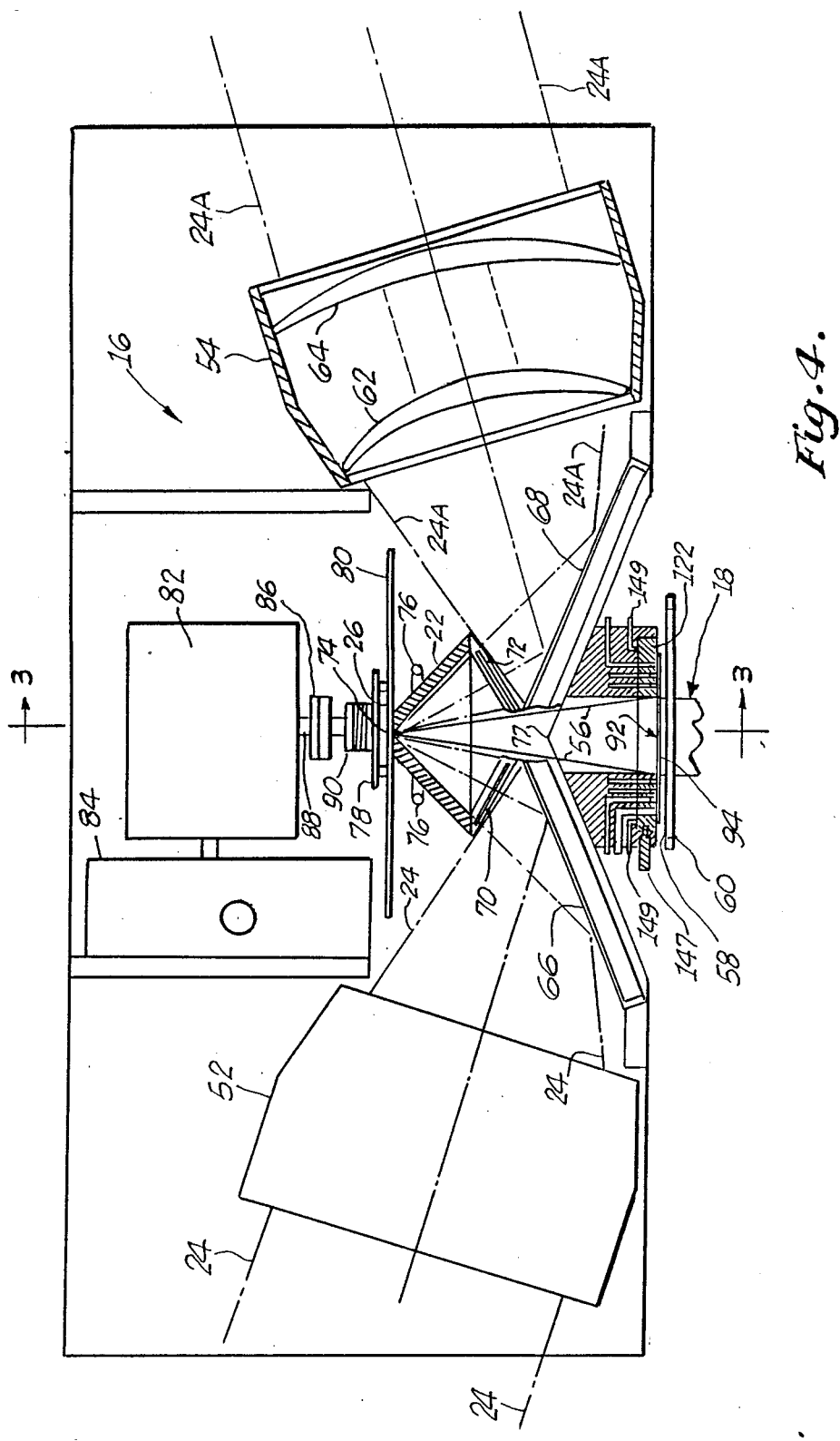

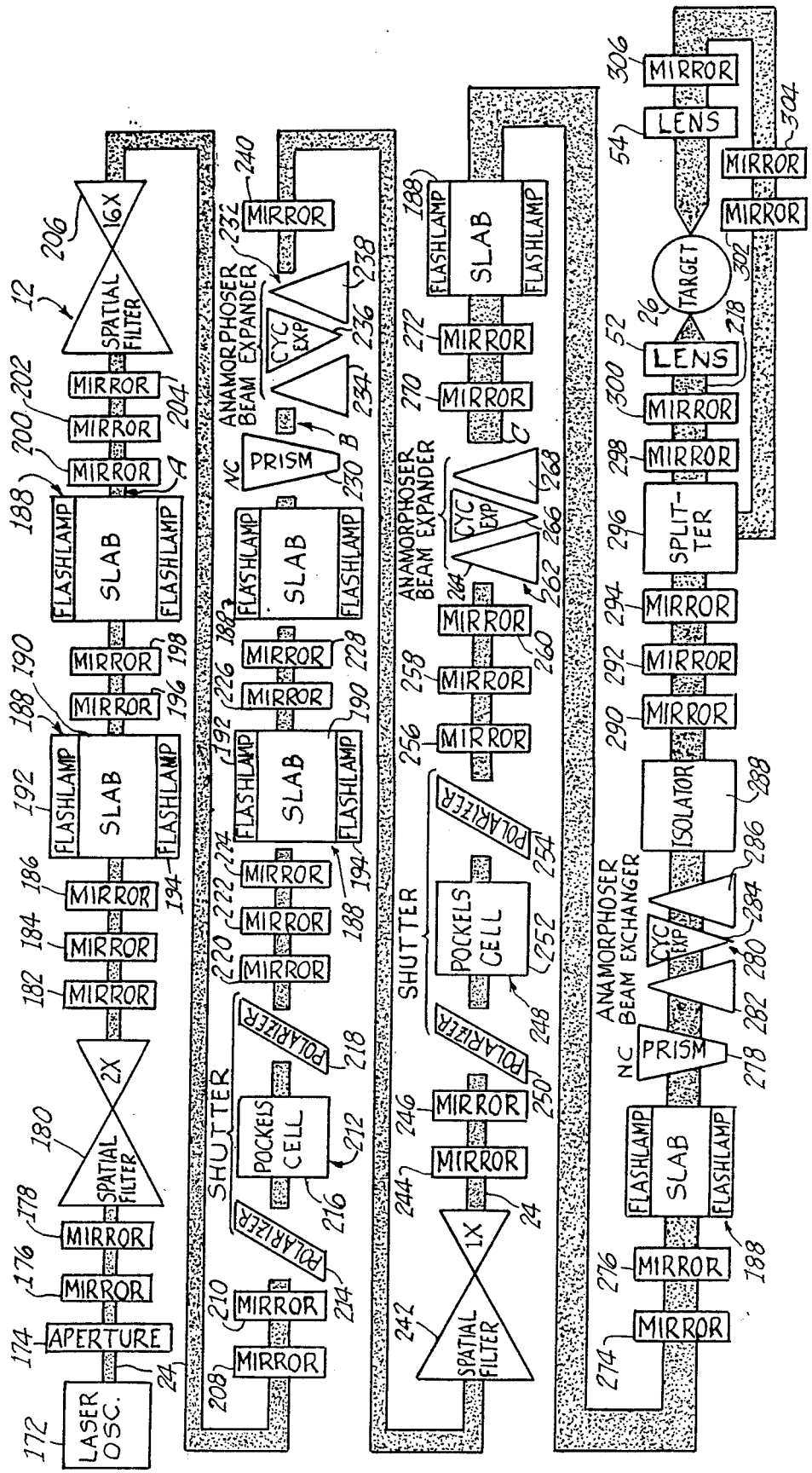

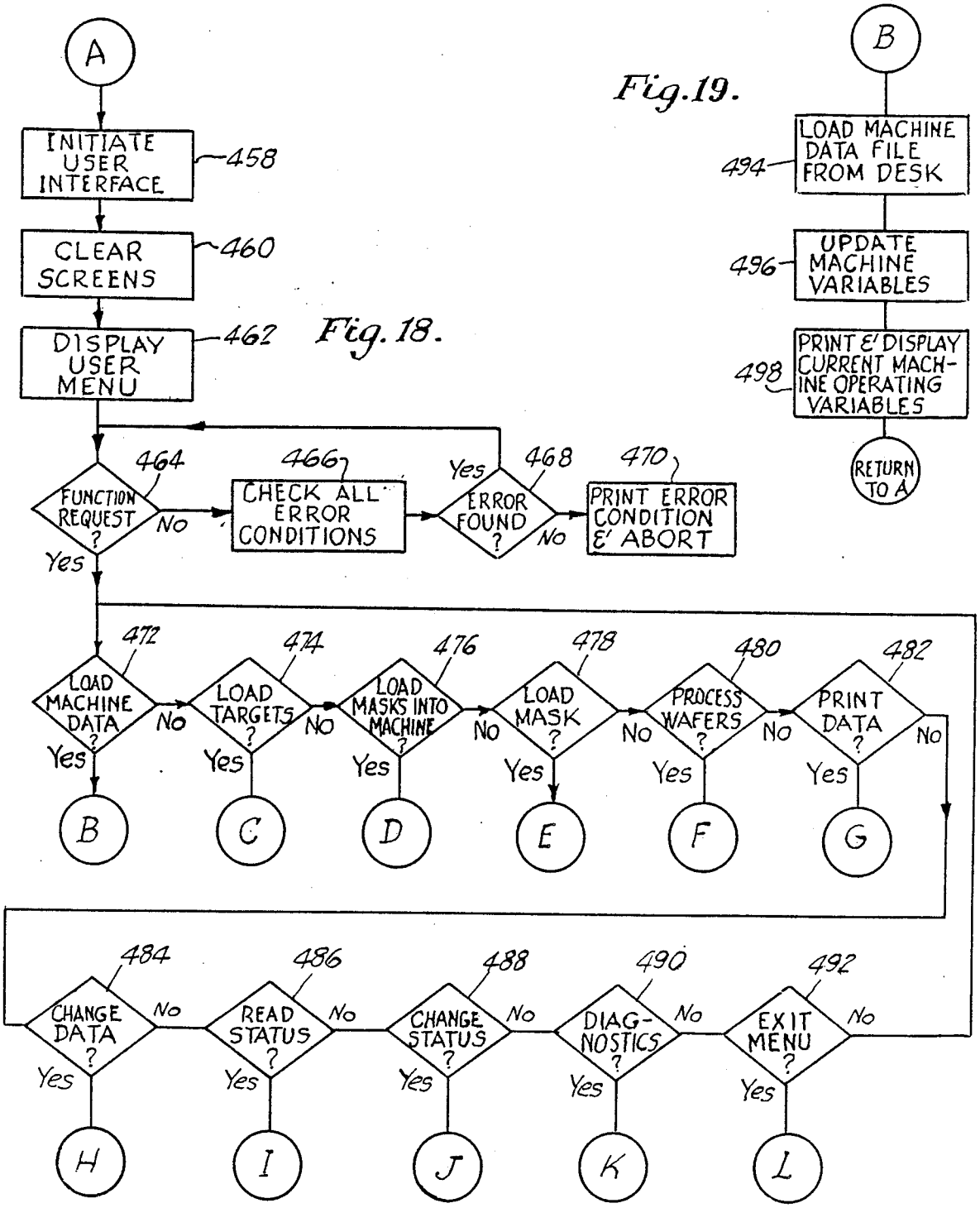

X-RAY LITHOGRAPHY SYSTEM

This is a continuation of application Ser. No. 06/852,108, filed Apr. 15, 1986, now abandoned.

This invention relates to an x-ray lithography system and more particularly, to such a system in which x-rays are generated by a laser beam striking a target with sufficient power to create an x-ray emitting plasma.

Semiconductor chips have been made by a process called lithography for many years. Typically, an energy source provides ultraviolet light through a mask which causes a pattern to appear on a resist coated silicon wafer. The light not blocked by the mask exposes the resist on the wafer and either the exposed or unexposed resist can be etched away, leaving a pattern on the wafer which can be further processed by known techniques.

As the demands for denser and denser semiconductor chips occur, a limitation on the use of ultraviolet light has been found. This limitation is due, among other reasons, to the wavelength of the light and the ability to make optical systems with sufficient resolution. Both of these reasons result in a finite size of line, in the order of 1.0–1.5 microns, which can be placed on the chip. It has been known for several years that to break the density barrier of ultraviolet light photolithography processing, a different energy source must be used. One type of energy source which has been widely suggested has been x-rays, which have a shorter wavelength than ultraviolet light and do not require sophisticated optical devices. X-ray lithography was first suggested by Smith, et al, in U.S. Pat. No. 3,743,842 entitled Soft X-Ray Lithographic Apparatus and Process. Later, Nagel, et al, in U.S. Pat. No. 4,184,078 suggested using a plasma emitting x-ray source to generate the x-rays. Of particular significance herein is the embodiment of Nagel et al in which a laser was focused on a metal target and caused the plasma to be created. Improvements to the basic Nagel technique have been made by the assignee hereof in U.S. patent application Ser. Nos. 669,440, 669,441 and 669,442, which relate to improvements in the x-ray generating source means.

In accordance with one aspect of this invention, there is provided an X-ray lithography system having means for generating a pair of high energy laser beams, and a chamber, to be evacuated, having a pair of hermetically sealed windows in the side walls thereof, a first opening at one end thereof and a second opening at the other end thereof. The system further has means for directing and focusing the pair of laser beams through the windows towards a focal point at the first opening, means for holding, positioning and moving a target so that the target moves at the focal point while a vacuum seal is formed around the first opening and means for holding and moving a resist covered wafer and for forming a vacuum seal over the second opening while the wafer is held and moved. Lastly, the system includes control means for controlling the generation of the laser beam, the evacuation of the chamber and the movement of the target holding, positioning and moving means and the wafer holding and moving means.

One preferred embodiment of the subject invention is hereafter described, with specific reference being made to the following Figures, in which:

FIG. 4 shows a more detailed front view, partially in cross section, of the x-ray source of the subject invention;

FIG. 11 is a schematic diagram representing the laser system of the subject invention;

FIG. 12 shows the shape and position in the amplifier glass slab of the laser beam during various passes through the amplifier, as shown in FIG. 11;

FIG. 16 shows the manner in which

FIGS. 16A and 16B show a more detailed electrical system diagram of the subject invention;

FIG. 18 shows a flow diagram of the stand-by operation of the subject invention;

FIG. 19 shows a flow diagram of the manner in which data is loaded into the computer of the subject invention;

Figure 1:
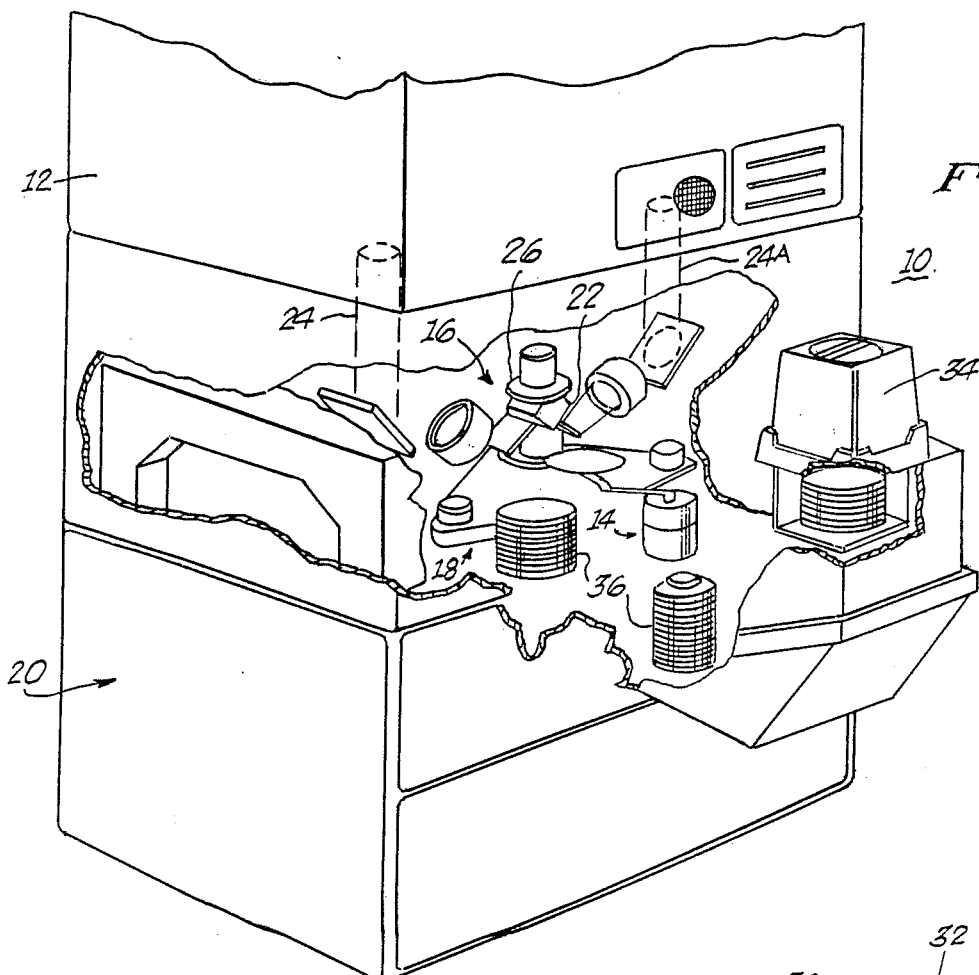
FIG. 1 shows a prospective view, partially in cutaway, of the x-ray lithography system of the subject invention.

Referring now to FIG. 1, X-ray lithography (XRL) system 10 is shown. System 10 includes a laser system 12, a materials handling system 14, an x-ray generating system 16, a wafer handling system 18 and a control system 20. Laser system 12 includes of a high powered and high repetition rate laser oscillator and amplifying means, together with a plurality of filters, shutters and mirrors, to cause a pair of powerful laser beams to be directed into the x-ray generating system 16. The details of the laser system 12 are explained hereafter with respect to FIGS. 11–14.

The x-ray generating system 16 includes an evacuated chamber 22 into which is focused a pair of laser beams 24 and 24A from laser system 12. The beams 24 and 24A are directed to strike a target 26 interfaced with chamber 22, causing a plasma to result. As with any plasma, x-rays are emitted, which x-rays travel through the evacuated chamber 22, and through the x-ray transmissive parts of a mask positioned within the chamber, towards a silicon wafer on wafer handling system 18. The mask and a desired portion of the wafer are placed and maintained in proper position and alignment by the material handling system 14. Each of the systems 12, 14, 16 and 18 are controlled by the control system 20.

Referring now to FIG. 1, the material handling system 14 is shown and includes a robot 28 having an arm and platform mechanism 30. Robot 28 controls its arm and platform 30 to pick-up and move a member 32, such as a wafer, target or mask. A stack of members 32 to be moved may be loaded into XRL System 10 using an SMIF container 34, which is designed to maintain a purified air atmosphere therein to avoid contamination of the member 32 while being moved or loaded. XRL System 10 includes two receptacles to receive SMIF containers 34, one in the front, as seen in FIG. 1, and the other on the side (not seen).

Robot 28 may be controlled to remove the members 32 inserted into system 10 using container 34 and to stack them in various positions 36. From the positions 36, robot 28 may later move an individual member 32 into proper position, which position is described in more detail hereafter. After a wafer is completely processed it may be returned to container 34 and when container 34 is full, it may be removed from system 10 and taken to the next processing station. Similarly, unused masks or used targets can be removed using robot 28.

Figure 2:
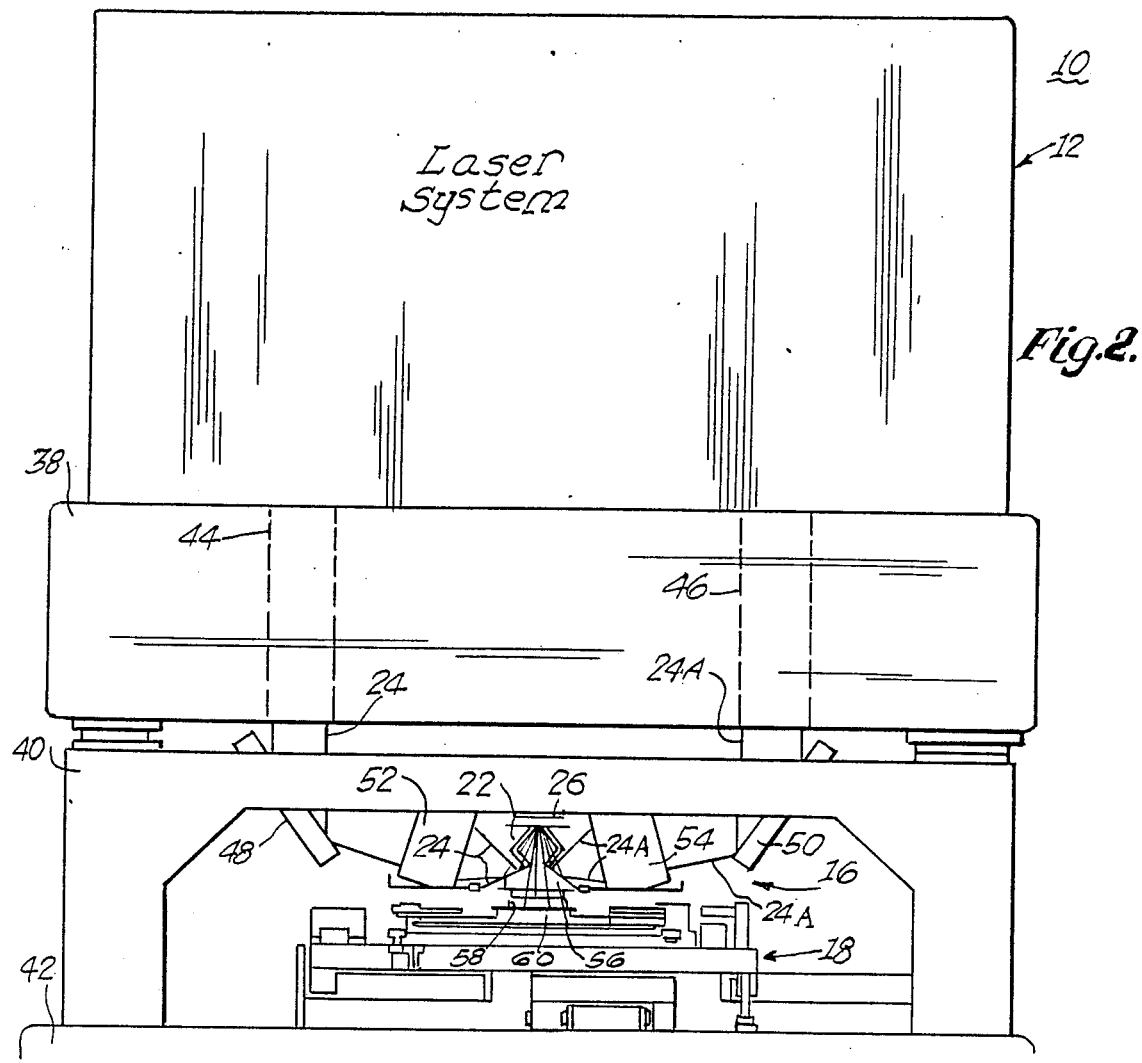
FIG. 2 shows a plan front view of the wafer processing and a portion of the x-ray source of the x-ray lithography system of the subject invention.

Referring now to FIG. 2, a plan view from the front of XRL System 10 is shown with the external panels removed so that the wafer handling system 18 and portions of the x-ray generating system 16 seen. In FIG. 2, laser system 12 rests on a granite slab 38. Slab 38, in turn, rests on a platform 40 which, rests on a second granite slab 42. While not seen in FIG. 2, granite slab 42 is held by a support above the control system 20.

Both granite slabs 38 and 42 are designed to have very flat and uniform top surfaces. This is particularly necessary in the case of support 42 to enable wafer handling system 18 to properly operate and position the wafer being processed in proper alignment. Further, each of the granite slabs 38 and 42 are extremely heavy, and thus, prevent any vibrations from affecting the proper operation of system 10.

Granite slab 38 has a pair of vertical holes 44 and 46 positioned through the interior thereof to allow the two laser beams 24 and 24A from laser system 12 to be directed towards the x-ray generating system 16. Each of the two holes 46 are aligned with a mirror 48 and 50 respectively. Each of the mirrors 48 and 50, in turn, reflect the laser beams 24 and 24A towards focusing lenses 52 and 54 respectively, which focus the laser beams at a small point on the target 26 area. The details of this structure will be explained hereafter with respect to FIG. 4.

After the laser beams 24 and 24A have been focused on target 26, the resulting plasma at target 26 generates x-rays 56 throughout chamber 22, some of which are directed towards wafer 58. A mask, positioned within chamber 22 between the plasma and wafer 58, causes a pattern of x-rays to strike wafer 58. This pattern exposes the resist layer covering wafer 58 so that wafer 58 can be further processed.

Wafer 58 is moved in discrete steps by wafer handling system 18. Wafer handling system 18 includes a chuck 60 which is moveable in the X, Y, Z and theta directions, so as to properly position wafer 58 at the desired place in alignment with the pattern of x-rays 56 from chamber 22. It is necessary that wafer 58 be very precisely positioned within a few tenths of a micron because the various steps used in processing wafer 56 require alignment to that accuracy. The wafer handling system 18 may be any conventional wafer stepper device, such as the one used in the Ultrastep 1000 Photolithography System described in more detail in the name of Martin E. Lee, U.S. Pat No. 4,444,492 and entitled "Apparatus for Projecting a Series of Images onto Dies of a Semiconductor Wafer".

Figure 3:
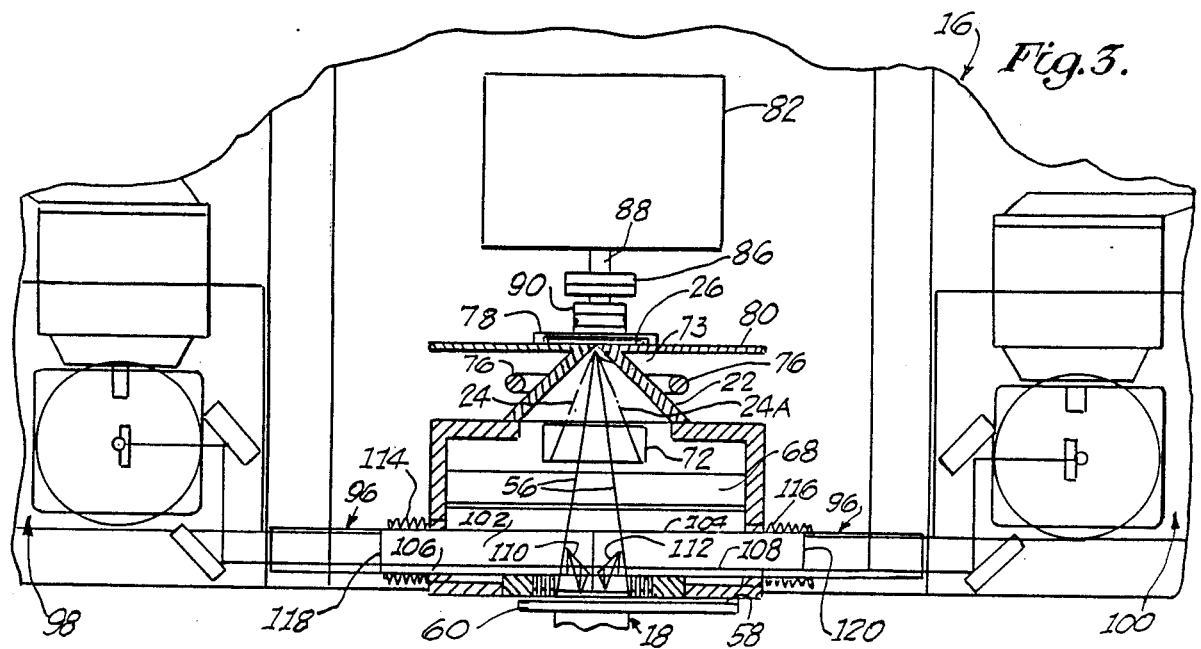
FIG. 3 shows a more detailed side view, partially in cross section, of the x-ray source of the system of the subject invention.

Referring now to FIGS. 3 and 4, X-ray generating system 16 is shown in more detail. More specifically, FIG. 3 shows a side view, including the interior details of chamber 22, and FIG. 4 shows a front view, including interior details of chamber 22. Laser beams 24 and 24A, applied from laser system 12 through openings 44 and 46, are deflected by mirrors 48 and 50 to pass through focusing lenses 52 and 54. In FIG. 4, focusing lens 54 is shown in cut-away and consists of a plurality of focusing lenses 62 . . . 64. Laser beams 24 and 24A pass through focusing lens 52 and focusing lens 54 and are reflected by respective mirrors 66 and 68, positioned on the outside of chamber 22, through windows 70 and 72, respectively, towards target 26. Focusing lenses 52 and 54 and mirrors 66 and 68 are positioned such that when laser beams 24 and 24A are focused by lenses 52 and 54 and reflected by mirrors 66 and 68, they impinges upon a single small spot 74, which may be on the order of 50 to 100 microns in diameter, on target 26. Thus, the center-line distance from lenses 52 or 54, respectively, to spot 74 as reflected by mirrors 66 or 68, respectively, is equal to the focal lengths of lenses 52 or 54.

Chamber 22 is desirably an evacuated chamber having a pressure of less than a few Torr. The gas remaining within chamber 22 is preferably an inert gas, such as helium. In order to maintain the vacuum, as laser beams 24 and 24A enter into chamber 22, windows 70 and 72 are hermetically sealed with the sides of chamber 22. Target 26 is positioned at the top of chamber 22 to allow it to both be moved and to provide a vacuum seal, as described hereafter with respect to FIGS. 8 and 9. The bottom of chamber 22 is also hydrodynamically sealed and moveable across wafer 38 as described in more detail with respect to FIGS. 5, 5A, 6, 7 and 7A.

As laser beams 24 and 24A are focused by lenses 52 and 54 and reflected by mirrors 66 and 68 towards a focal point spot 74, the temperature of target 26 increases to greater than a million degrees centigrade. Target 26 may be any conventional metal material, such as stainless steel, and when the laser beams 24 and 24A are focused at spot 74, a plasma is created which emits x-rays 56 throughout the entire evacuated inner portion of chamber 22. One manner in which the plasma is emitted is described in more detail in U.S. patent application Ser. No. 669,441 in the name of James Forsyth and assigned to the assignee hereof.

When the plasma is generated, two types of contaminants are emitted from the plasma, in addition to the x-rays. The contaminants are dust particles, which result from the evaporating metal, and charged particles. A magnet 76 may be placed around the outside of container 22, as shown in FIG. 3, or alternately, within container 22, and is poled to deflect the charged particles away from the critical area where the lithography processing is occurring. The positioning of magnet 76 should be out of the path of laser beams 24 and 24A and thus preferably will be outside of container 22. Much of the dust particles will fall harmlessly onto the structure supporting windows 70 and 72 out of the path of the x-rays 56 critical to the lithography process. The dust particles in the x-ray 56 path will be blocked by an x-ray transmissive membrane 77. Membrane 77 may be a silicon membrane, held by a conventional support, and means may also be provided to move, or remove, membrane 77 together with its support, in order to remove the dust particles collected thereon from the x-ray path.

In order to make XRL system 10 useful in production applications, it is desirable that target 26 have a life exceeding 4 to 8 hours. One technique for extending the life of the target has been previously described in James S. Forsyth U.S. patent application Ser. No. 669,440 and assigned to the assignee hereof. In that Patent Application, targets in the shape of either a cassette held strip of metal or a metal drum shaped object were shown as being placed wholly within the evacuated portion of chamber 22. In XRL System 10, a plate, or disc shaped object is utilized as target 26. Laser beams 24 and 24A may be focused at separate and distinct points along a plurality of different tracks of the disc shaped target 26. Further, it may be desirable to increase the usage of the disc material by firing a plurality of different laser pulses into areas in which cavities have been predefined on target 26, such as been described in U.S. patent application Ser. No. 669,440. Alternatively, a plurality of laser pulses may be fired into the target area for each exposure.

Target 26 may be held by a vacuum chuck 78, which is designed to be moved in both a circular and longitudinal direction over a plate 80, extending from the upper portion of chamber 22. The movement of chuck 78, and the held target 26, is under the control of a stepper motor 82 and a linear movement device 84. Linear movement device 84 may include a rotating screw which moves stepper motor 82 from the left to right, as seen in FIG. 4. Stepper motor 82 has a shaft extending therefrom which can be rotated in response to commands from the control system 20 by precise amounts, thereby causing chuck 78, and target 26 held thereby, to rotate around the various tracks of target 26. As soon as a complete rotation has occurred for a particular track, linear movement device 84 may be engaged to move stepper motor 82 so that a rotation around another track occurs. After all of the tracks of target 26 are used, target 26 is replaced by a new metal plate.

The shaft from stepper motor 82 is coupled to a ferrofluidic coupler 86 having a stationary portion and a rotating portion. The stationary portion may have air pressure and air vacuum lines coupled to it, which, in turn, are coupled to the rotating portion of coupler 86. Air pressure and vacuum paths are then coupled through shaft 88 to control both a bellows device 90, used to raise or lower chuck 78, and a plurality of vacuum ports, used to hold target 26 in place, depending on whether air is applied or removed through the ferrofluidic coupler 86. When it is desired to replace target 26, bellows device 90 is raised, thereby raising chuck 78 so that the arm and platform 30 of robot 28 can remove the spent target 26 and replace it with a new target.

In order for a sufficient intensity of x-rays to be generated, the plasma created should be in the partially evacuated chamber 22. Thus, at least the surface of target 28 which the laser beams 24 and 24A strike must be in the partial vacuum.

The structure by which chuck 78 forms a vacuum seal for maintaining the partial vacuum in chamber 22 and also forms an air bearing for allowing movement of target 28, as well as allows target 26 to be properly positioned so that laser beams 24 and 24A can be focused at spot 74, will be described hereafter with respect to FIGS. 8 and 9.

The bottom of chamber 22 has an opening 92 therein into which a mask 94 is to be positioned. Mask 94 may be any conventional x-ray mask, such as a silicon membrane having a pattern of a heavy metal, such as gold, deposited thereon. The pattern portion contained on mask 94 should be in alignment with the opening 92 at the bottom of chamber 22. The remaining portion of mask 94 is a support for the silicon membrane and a plurality of inlet and outlet paths for vacuum and pressure to be connected to maintain the seal, provide an air bearing and properly position the mask with respect to wafer 58. The exact manner in which the seal, air bearing and positioning occurs will be described hereafter with respect to FIGS. 5, 5A, 6, 7 and 7A.

Positioned generally in the lower part of chamber 22 above mask 94, is the wafer alignment mechanism 96. Alignment mechanism 96 may be similar in concept to the alignment mechanism used to position and align wafers in conventional photolithography techniques, such as those utilized in the Ultrastep 1000 stepper described in the aforementioned U.S. Pat. No. 4,444,492. However, specific differences exist between the alignment mechanisms of x-ray lithography system 10 and the prior art, due, in part, to the requirement that the alignment techniques utilizes marks on mask 94 and mask 94 must be within the evacuated portion of chamber 22.

The alignment mechanism is best seen in FIG. 3 and includes a pair of optical emitters and detector units 98 and 100. Light is provided from and reflected light is provided back to each of emitter and detector units 98 and 100 through a pair of moveable chambers 102 and 104. Each of the chambers 102 and 104 is shown in the closed position in FIG. 3, which occurs when wafer 58 is being moved by wafer handling system 18. Light beams 106 and 108, provided from mercury arc lamps in the emitter portion of emitter and detector units 98 and 100, travels through chambers 102 and 104, which function as a microscope, and is reflected by mirrors 110 and 112 towards wafer 58. As long as a predefined optical alignment mark is not in the path of the light from beams 106 and 108, light is reflected back along the same path towards mirrors 110 and 112. A small hole in the mirrors 110 and 112, coupled by a fiber optic cable to the detector part of emitter and detector units 98 and 100, provides a path for the reflected light to be detected. Whenever the alignment markers appearing on wafer 58 are moved into the path of light beams 106 and 108, the light is scattered away from the original path and the scattered light is detected by units 98 and 100 to indicate that the wafer has moved to a certain aligned position.

As soon as wafer 58 is properly positioned by the emitter and detector units 98 and 100, electrical signals are provided to control system 20, which, in turn, causes wafer handling system 18 to stop moving wafer 58. At the same time, signals are provided to cause moveable chambers 102 and 104 to move out of the path of the x-rays 56 from spot 74 through opening 92. The two moveable chambers 102 and 104 are each coupled to chamber 22 by bellows connectors 114 and 116 which allow the partial vacuum within chamber 22 to be maintained regardless of the position of chambers 102 and 104. The light beams 106 and 108 are applied through hermetically sealed windows 118 and 120 at the ends of chambers 102 and 104. When moveable chambers 102 and 104 are moved out of the path of the x-rays 56, the laser beams 24 and 24A can be provided and focused on spot 74 to cause the x-rays to be generated and be applied through the evacuated interior of chamber 22 towards mask 94 to cause a pattern of x-rays to be provided to wafer 58. Thereafter, the bellows connectors 114 and 116 are controlled to move chambers back to the position shown in FIG. 3 and wafer 58 is moved and aligned in the next position in the manner previously described.

Figure 5:
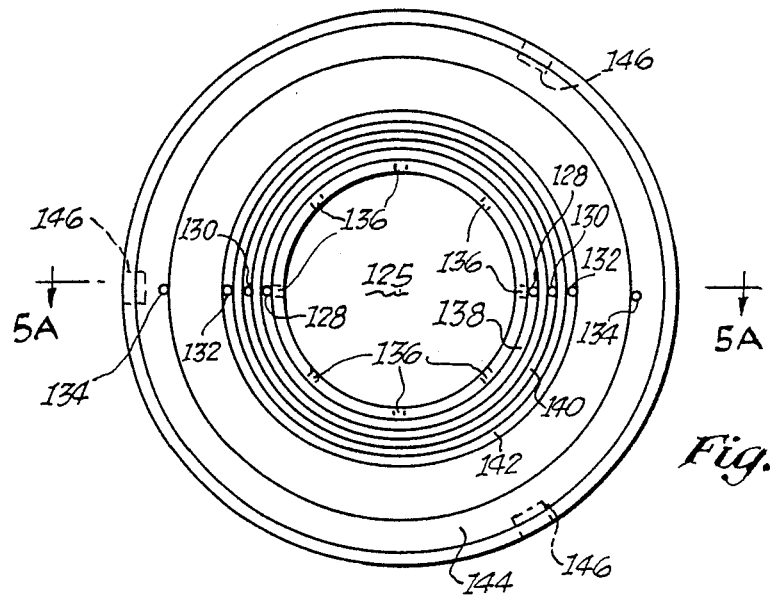
FIGS. 5 and 5A show one type of interface between the x-ray emitting chamber and the wafer of the subject invention.
Figure 5A:
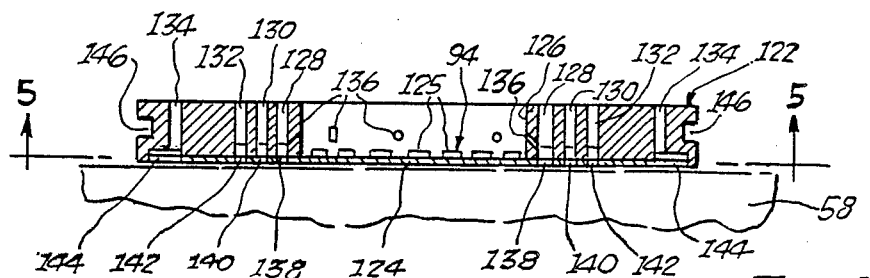

Referring now to FIGS. 5, 5A, 6, 7 and 7A, the air bearing, seal and mask to wafer gap monitoring mechanism between the bottom of mask 94 and the resist layered surface of wafer 58 will now be described. One embodiment of this structure is shown in FIGS. 5 and 5A and includes a mask support ring 122 having a silicon membrane 124 attached to the bottom side thereof. The pattern 125 on mask 94 is fabricated on the portion of silicon membrane which extends over an opening 126 of support ring 122. As seen in FIG. 4 and described herein in more detail, support ring 122 may be inserted in the bottom of chamber 122 in alignment with certain inlet and outlet paths through which gas may be pumped or evacuated.

The inlet and outlet paths from chamber 22 extend into mask support ring 122 and include vacuum paths 128 and 130, which are the inner two paths from the center of support ring 122, as seen in FIG. 5 and 5A, a helium pressure path 132 and an air, or nitrogen, pressure path 134. There is a significantly longer distance between paths 132 and 134 than between paths 128 and 130 or 130 and 132. A vacuum pump may be attached to the exit side of paths 128 and 130 near the bottom of chamber 22 and helium may be pumped through path 132 and air, or nitrogen, may be pumped through path 134 from the inlets to those paths near the bottom of chamber 22.

The bottom of mask support ring 122 and silicon membrane 124 have a plurality of rings 138, 140, 142 and 144 therein. Ring 138 is coupled to path 128 and ring 140 is coupled to path 130. Thus, any gas which is in the area of rings 138 or 140 is evacuated through paths 128 and 130. In the same manner, ring 142 is coupled to path 132 and ring 144, which is substantially wider than the other rings 136, 138 and 140, is coupled to path 134.

Figure 1A:
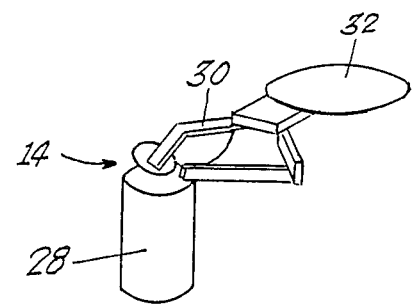

Three prealignment notches 146 are positioned on the side of mask support ring 122 and, together with corresponding solenoids 147, are used to prealign mask support ring 122 within the area of the bottom of chamber 22. This is done during the time robot 28, shown in FIG. 1A, moves a mask 94, which includes mask support ring 122 and silicon membrane 124, from the stack of masks into the position shown in FIG. 4. Once mask 94 is positioned by the arms of solenoids 147 extending into notches 146, mask 94 is held in position by a vacuum path 149.

Figure 6:
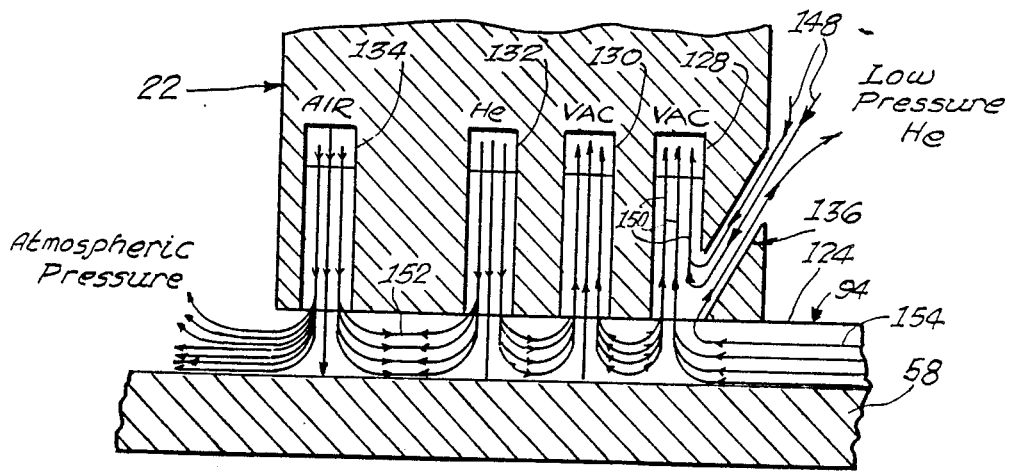
FIG. 6 shows a drawing useful in understanding the operation of the subject matter shown in FIGS. 5 and 5A.

Referring now to FIG. 6, the manner in which mask support ring 122 and silicon membrane 124 function to provide the vacuum seal, air bearing and mask to wafer vertical gap positioner will now be described. First, however, it should be understood that the interior portion of chamber 22 is at a relative pressure of, for example, less than a few Torr, whereas, the outside of chamber 22 is at normal atmospheric pressure of approximately 760 Torr. Further, the distance between the pattern portion 125 of membrane 124 and the top of wafer 58 must be critically controlled to be approximately 30 microns. In addition, wafer 58 must be readily moveable with respect to mask support ring 122 and silicon membrane 124 without disturbing the pressure within the evacuated inner portion of chamber 22.

By providing a vacuum pump connection to paths 128 and 130 and by connecting path 128 into the interior of chamber 22 by path 136, the low pressure vacuum within chamber 22 is maintained, as indicated by the lines 148 and 150 in FIG. 6. The use of two or more channels, such as paths 128 and 130, allows the pressure within chamber 22 to be maintained at a relatively low value, such as less than a few Torr. Such a vacuum seal has been previously utilized in the Varian Microseal system wafer transport and handling mechanism to maintain a vacuum within an electron beam chamber. However, if one could utilize this structure to additionally maintain the distance between membrane 124 and the top of wafer 58 at a precise value as well as allow relative movement on both sides of the seal, additional other structure could be eliminated.

To obtain these added features, paths 132 and 134 are utilized. Helium is applied through path 132 and air, or nitrogen, is applied through path 134. By adjusting the pressure of the helium and the air, or nitrogen, applied through paths 132 and 134, a high pressure can build up at point 152, shown in FIG. 6. This high pressure at point 152, in conjunction with the relatively low evacuated pressure at other portions, such as point 154 beneath membrane 124 in the critical areas where the exposure takes place, maintains the distance between membrane 124 and the top of wafer 58 at a precise distance. This distance can be varied by varying the pressure of the helium and air passing through paths 132 and 134. Further, the high pressure at point 152 acts as an air bearing, allowing friction free movement between membrane 124 and wafer 58. Despite such movement, the evacuation at openings 128 and 130 still maintains the vacuum within chamber 22 and on both sides of the membrane 124. Further, the constant evacuated pressure on both sides of membrane 124 prevents warping of membrane 124 from occurring.

Figure 7:
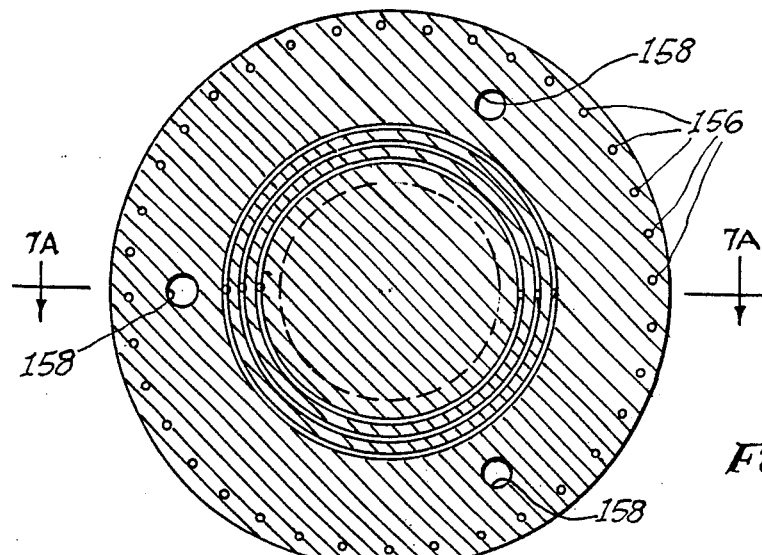
FIGS. 7 and 7A show an alternate embodiment of the interface between the x-ray generating chamber and the wafer.
Figure 7A:
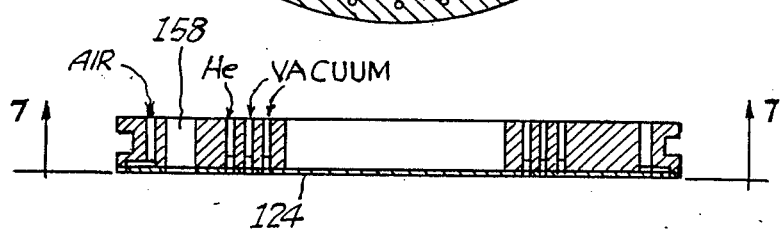

Referring now to FIGS. 7 and 7A, an alternate embodiment of the concept described with respect to FIGS. 5, 5A and 6 is shown. In this instance, ring 144 of FIG. 5 is replaced by a series of small holes 156 through the membrane 124. In addition, three gap sensors 158 are included to sense the gap distance between membrane 124 and wafer 58. Such gap sensors may be of the type utilized in the Ultrastep 1000 photolithography system to seek identical back pressure for each sensor to achieve a parallel alignment between membrane 124 and wafer 58.

Figure 8:
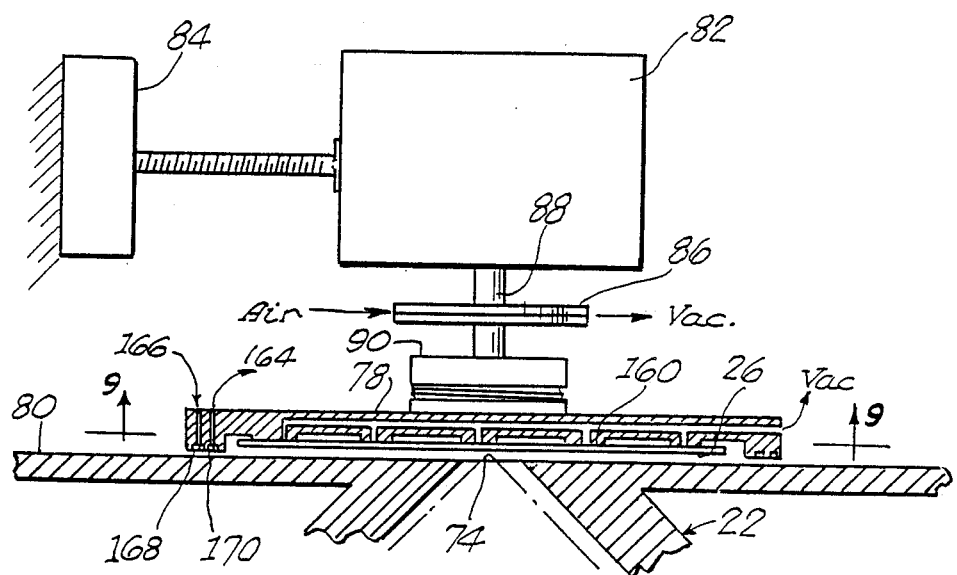
FIG. 8 shows a diagram of the target and associated target moving mechanism used in generating the x-ray emitting plasma.
Figure 9:
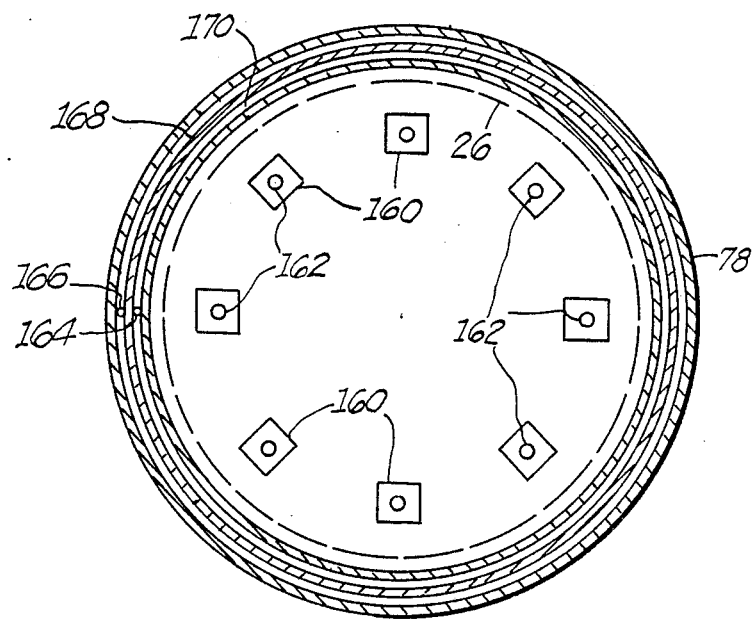
FIG. 9 shows a bottom view of the target moving mechanism used to interface the target and the vacuum chamber of the subject invention.

Referring now to FIGS. 8 and 9, the vacuum seal and air bearing between the chuck 78 holding target 26 and plate 80 at the top of chamber 22 is shown. Target 26 is held firmly against the recessed center of chuck 78 by a plurality of vacuum supports 160, each of which has an evacuation port 162 at the center thereof connected to a vacuum pump (not shown).

When it is desired that target 26 be moved by motor 82 and/or linear movement device 84, the nonrecessed peripheral edge of chuck 78 is to glide over plate 80. An air bearing and seal, similar to that described with respect to FIG. 6, in the peripheral edge of chuck 78 prevents loss of the vacuum from within chamber 22 and allows friction free movement of chuck 78 with respect to plate 80. In this instance, however, only a single vacuum path 164 and a single air path 166 are utilized. Each of the paths 164 and 166 are connected to rings 168 and 170 at the bottom of chuck 78. The air pressure into path 166 and the vacuum from path 164 causes the air bearing and seal, described with respect to FIG. 6. In practice it may be desirable to utilize a plurality of vacuum paths 164 and rings 168 and a plurality of pressure paths 166 and rings 170, such as shown in FIG. 6, in order to obtain the vacuum and adjust the distance in a more accurate fashion.

Figure 10:
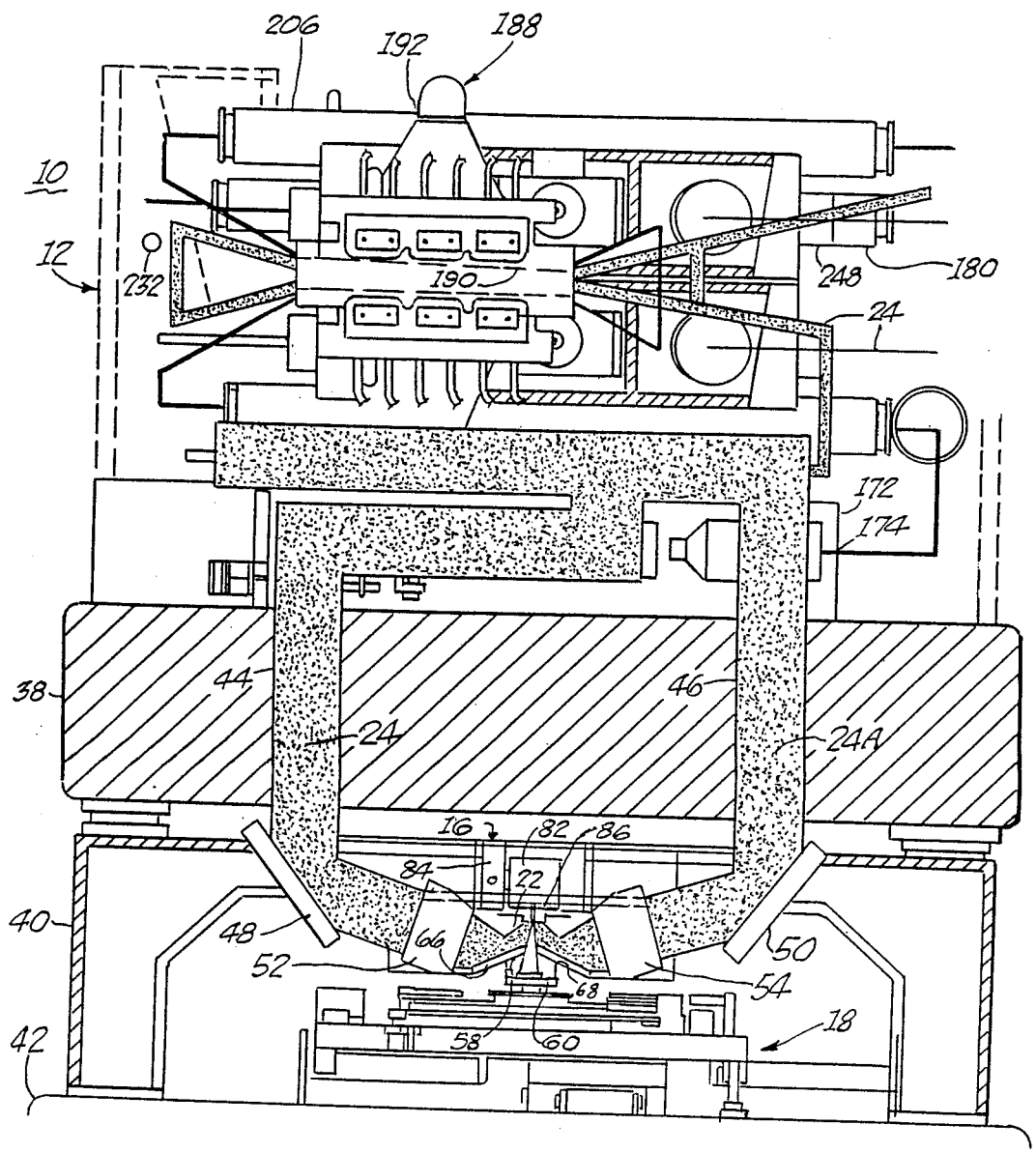
FIG. 10 shows the laser system and path of the laser beam used in generating the x-ray emitting plasma.

Referring now to FIGS. 10, 11, 12, 13 and 14A through 14C, the laser system 12 will now be described. FIG. 10 shows the manner in which a single laser beam 24 is generated by laser system 12, subsequently passed through a beam splitter to form the dual beams 24 and 24A that are passed through the two holes 44 and 46, reflected by the two mirrors 48 and 50 through focusing lenses 52 and 54 and reflected by the two mirrors 58 and 60 into the chamber 22. The reason that two beams 24 and 24A are utilized is that the power required of the laser to create the plasma is so great that handling the beam with conventional mirror and focusing equipment would result in short component lifetimes, even with special dielectric coatings. By reducing the intensity in each of the two laser beams 24 and 24A applied into chamber 22 by approximately 50 percent, conventional component materials may be used with a normal useful life for those materials. This is particularly important because some of the component materials through which the laser beam passes can become very expensive to replace.

Figure 13:
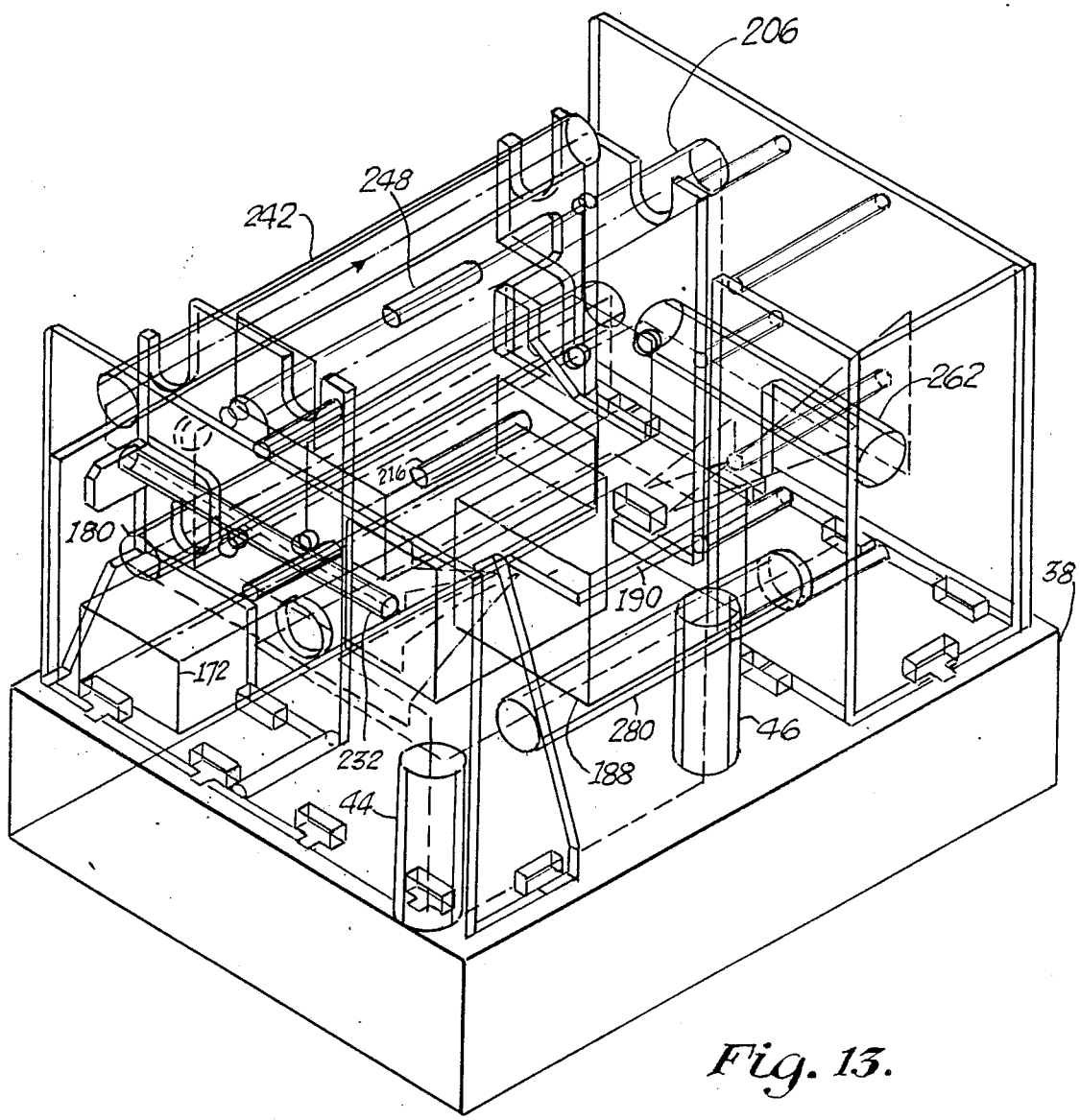
FIG. 13 shows a three dimensional view of the component placement of the laser system shown in FIG. 11.
Figure 14A:
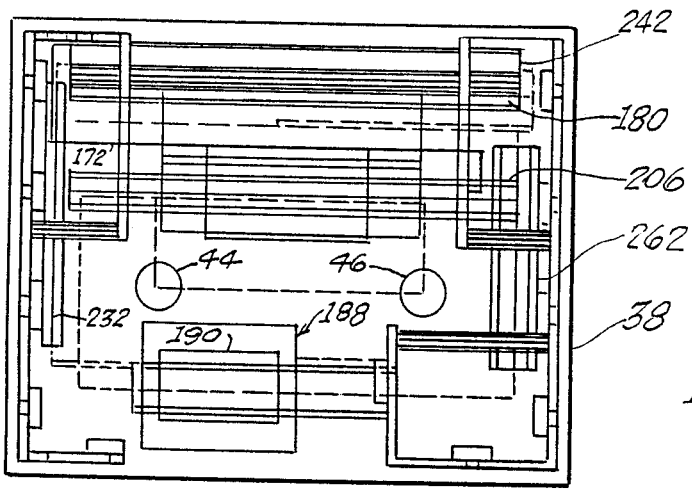
FIGS. 14A, 14B and 14C represent respectively the top, front and side views of the view shown in FIG. 13.
Figure 14B:
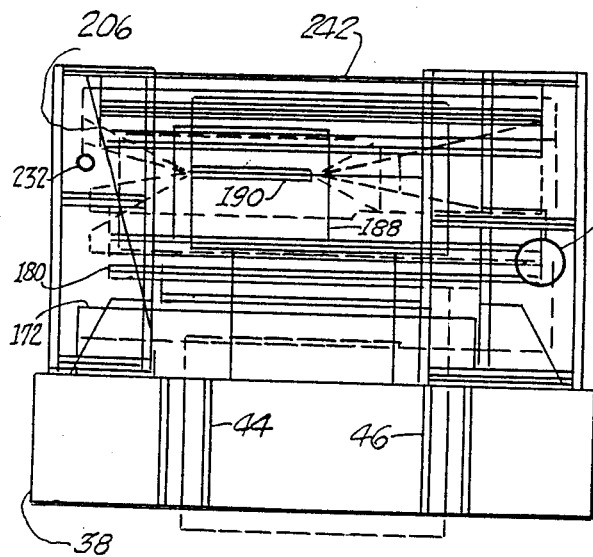
Figure 14C:
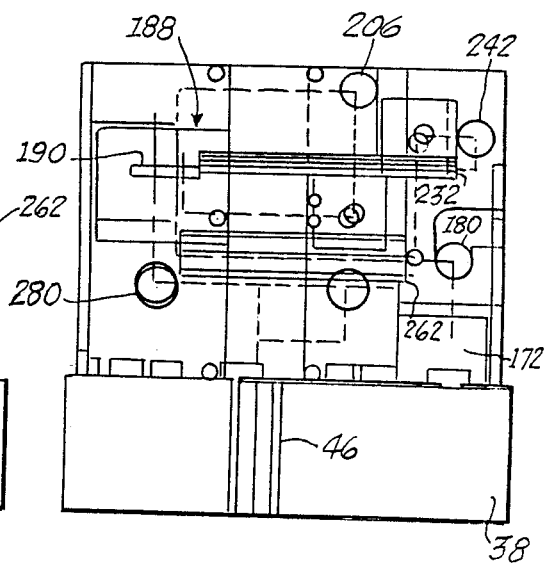

FIG. 11 shows schematically the manner in which the dual laser beams 24 and 24A are generated and FIG. 12 shows the shape and position of the laser beam 24 during each of its three passes through the laser amplifier. FIG. 13 shows a three dimensional representation of the positioning of each of the major components to be described in FIG. 11 and FIGS. 14A, 14B and 14C show respectively, the top, front and side views of the three dimensional structure shown in FIG. 13. Hereafter, the individual components will be described in detail with respect to FIG. 11, with reference to FIG. 12 on occasion. Numerical designations of the components have been added to FIGS. 13 and 14A through 14C, but no specific description is given.

In FIG. 11, a conventional laser oscillator 172 provides a narrow laser beam 24 through an aperture 174. The beam 24 is reflected by mirrors 176 and 178 through a spatial filter 180, which increases the size of the beam 24 by approximately two times. It should be noted that the major components described in FIG. 11 have been marked with numerical designations in FIGS. 13 and 14A, 14B and 14C. However, the minor components, such as mirrors 176 and 178 and aperture 174, have been deleted from FIGS. 13, 14A, 14B and 14C to increase the clarity of those Figures.

The laser beam 24 from spatial filter 180 is again reflected by mirrors 182, 184 and 186 and provided through the laser beam amplifier 188. Amplifier 188 consists of a neodynium doped slab of glass, surrounded by a pair of flash lamp elements 192 and 194. The laser amplifier 188 is similar to the type described in William S. Martin et al U.S. Pat. No. 3,633,126 and entitled "Multiple Internal Reflection Face Pumped Laser". Generally, the beam 24 incident to the laser amplifier 188 picks up the energy stored in the glass resulting from energizing the flashlamps 192 and 194. Thus, the laser beam 24 at the output of laser amplifier 188 is significantly more powerful than the laser beam 24 incident thereto.

Next, the laser beam 24 is reflected by mirrors 196 and 198 back through laser amplifier 188 along the same path as previously traveled. When the laser beam 24 exits amplifier 188 on the second pass, it is shaped and positioned as shown by beam A, in FIG. 12.

Next, the laser beam 24 is directed by mirrors 200, 202 and 204 to enter spatial filter 206, which magnifies the size of the beam 24 by a factor of approximately 1.6 in all directions. Thereafter, the laser beam 24 is reflected by mirrors 208 and 210 through a shutter assembly 212. Shutter assembly 212 consists of a linear polarizer 214, Pockels cell 216 and a second linear polarizer 218, which is rotated 90 degrees with respect to the first polarizer 214. Pockels cell 216 is controlled by signals from the control system 20 and, as is well known, changes the polarization of the beam incident thereto by 90 degrees when enabled. Thus, when the Pockels cell 216 is enabled, beam 24 continues to pass through shutter 212 and when Pockels cell 216 is not enabled laser beam 24 is blocked by polarizer 218. It should be noted that shutter 212 operates the same in both directions, so that any reflected beam would be blocked just as the beam originated within oscillator 172 is blocked when Pockels cell 216 was not enabled. Thus, the enable signal for Pockels cell 216 from control system 20 should be a very short pulse, timed to only allow the primary beam 24 pulse or pulses generated by oscillator 172 to pass, and to block any reflected beams.

Next, mirrors 220, 222 and 224 direct the laser beam 24 through amplifier 188 a second time and mirrors 226 and 228 direct the then amplified beam 24 back along the same path through amplifier 188. Upon exiting amplifier 188 for the second time, the laser beam 24 is positioned and shaped as beam B shown in FIG. 12. It should be noted that beam B is approximately 1.6 times as large as beam A due to the multiplication by spatial filter 206. Further, the mirrors 222 and 224 direct the laser beam 24, during the second pass through amplifier 188, along a different path through glass slab 190 than occurred during the first pass.

The output from amplifier 188 is redirected by a prism 230 into an anamorphic beam expander 232. The anamorphic beam expander 232 consists of three prisms, triangular shaped in one plane and rectangularly shaped in a second plane perpendicular to the first mentioned plane. Each of the three prisms act to expand the beam only in one direction. In this case, the three prisms 234, 236 and 238 of beam expander 232 expand the laser beam only in the X direction.

Thereafter, the beam 24 from beam expander 232 is directed by a mirror 240 through a spatial filter 242, which does not change the size of the beam 24. Next, the beam 24 is directed by mirrors 244 and 246 through a second shutter 248, which includes polarizers 250, Pockels cell 252 and polarizer 254. Shutter 248 operates in the same manner as previously described with respect to shutter 212. In order to stop all reflected beams, it is desirable to use a pair of shutters within the system, since some light leaks through the shutters.

Next, the laser beam 24 is directed by mirrors 256, 258 and 260 through a second anamorphic beam expander 262, which includes prisms 264, 266 and 268. Expander 262 again expands the beam 24 only in the X direction. From beam expander 262, the laser beam 24 is directed by mirrors 270 and 272 through amplifier 188 for a third pass and mirrors 274 and 276 redirect the beam 24 back through amplifier 188. During this third pass, the laser beam 24 appears as beam C in FIG. 12, which shows it has been greatly expanded in the X direction, but remains generally the same size in the Y direction as it was when it had the shape of beam B. Further, the mirrors position beam C at a different location along the slab 190 so that the beam can pick up the energy in slab 190 in that position. It should be noted that the spatial filters 180, 206 and 242, anamorphic beam expanders 232 and 262 and the cross sectional size of slab 190 are all selected so that laser beam 24 is expanded to not greater than the Y dimension size of slab 190 in the Y direction, but may be expanded to significantly greater than the Y dimension size in the X direction. This type of expansion allows laser beam 24 to absorb as much of the slab 190 stored energy as possible.

Upon leaving amplifier 188, after the third pass therethrough, laser beam 24 is directed by prism 278 through a third anamorphic beam expander 280, consisting of prisms 282, 284 and 286, which expand beam 24 in the Y direction so that it again becomes of generally circular cross section. From expander 280, the beam 24 is passed through isolator 288 and directed by mirrors 290, 292 and 294 to a beam splitter 296. Beam splitter 296 splits the incident laser beam 24 into two separate and generally equal intensity beams 24 and 24A. One of the beams 24 from beam splitter 296 is directed by mirrors 298 and 300 through opening 44 to lens 52 and on to target 26, as previously described. The second beam 24A from beam splitter 296 is directed by mirrors 302, 304 and 306 through lens 54 towards target 26 utilizing opening 46 in the granite slab 38.

The operation of laser system 12 is designed according to the following considerations. The production of intense pulses the following considerations. The production of intense pulses of soft x-rays by means of focussing high peak power laser pulses onto suitable targets has an important commercial application in the field of soft x-ray lithography. As described in the aforementioned U.S. Pat. No. 4,184,078, a pulsed neodymium laser is suitable for use in this application. When a neodymium laser is to be configured to generate a sufficiently intense pulse for such an application, one or more stages of amplification are normally employed in conjunction with a pulsed, typically Q-switched, neodymium oscillator. The degree of amplification of such pulses which can be conveniently achieved in compact systems is typically limited by the ability of optical surfaces employed subsequent to the amplifier system to withstand the intensity of the laser pulse without suffering permanent damage. This is especially true when multilayer dielectric optical coatings are employed to improve the efficiency of laser beam transport. By limiting the degree of amplification to that permitted by damage considerations, the amplifier medium typically exhibits significant further amplification potential after the passage of the laser pulse. This remaining amplification represents unused laser pump energy which is lost after a short interval of time due to radiative decay of the excited laser state in neodymium. In other words, this unused available energy corresponds to reduced system efficiency.

One approach to minimize this problem is to expand the cross sectional area of the laser beam immediately after amplification by the use of lenses and/or prisms. Such an approach is used in the NOVA system, a large pulsed neodymium system installed at the Lawrence Livermore National Laboratory, Livermore, Calif., to enable the extraction of the highest possible fraction of amplifier stored energy in the passage of a single laser pulse. Such an approach creates a significant penalty in the space devoted to housing the optical components of the laser system, that is, the output components are all substantially larger than the amplifier cross section. Typically, the cost to manufacture laser-quality optical components increases more rapidly than their cross sectional area, so both space and component costs are rapidly increased by this approach.

In the application of soft x-ray lithography, it is not necessary that all of the x-rays required to expose a mask pattern onto a suitable photoresist be delivered to the photoresist in a single pulse. Nagel, et al., have demonstrated multipulse x-ray lithography exposures using a repetitively pulsed Nd:YAG laser (Applied Optics 23, 1428 (1984). The laser system used in this work had a pulse repetition rate of 10 Hz, but required 20 minute exposure times into PBS photoresist as a result of the low intensity laser pulses used. Each laser pulse was separated in time by an interval which was long compared to the energy storage time in the amplifier. Thus, that system was not efficient.

In modern optical step-and repeat lithography machines, the time required to deliver ultraviolet light to achieve satisfactory photoresist exposures is typically in the order of a few hundred milliseconds or so. Therefore, an x-ray step-and-repeat lithography machine would be attractive for use in fine line production lithography, so long as the total exposure time is of the order of a few hundred milliseconds or less. Thus, in the operation of the laser system 12, the sequence of laser pulses must be produced by oscillator 172 within a time window of less than a few hundred milliseconds for the purpose of maximum lithographic system efficiency.

Optimization of both x-ray production and laser system efficiency requires consideration of several factors. To insure that a high fraction of the energy obtained from a multistage, pulsed laser amplifier system will be focussable to a high intensity, one or more spatial filters are typically included in the laser system. A spatial filter typically consists of a pair of positive lenses separated by the sum of their individual focal lengths, with a small pinhole located at the common focus. (See, for example, Hunt, et al., Applied Optics 17, 2053 (1978)). In high peak power systems designed for x-ray production, the laser intensity near the common focus will be so high as to cause air breakdown and a consequent loss of transmission through the filter. Thus, spatial filters in this application are typically evacuated. Nevertheless, some portion of the laser energy may strike the sides of the pinhole causing a plasma to form and expand into the pinhole. Such plasma formation may render the pinhole opaque until sufficient time elapses to allow the plasma to dissipate. This dissipation time limits the rate at which successive pulses may be propagated through the laser amplifier chain. If the hot material from the pinhole walls has an average velocity of 50,000 cm/sec (corresponding to approximately 1000 degrees K), then a pinhole of typically 200 microns in diameter would require a minimum of from 200–400 nsec to clear. This sets a lower limit on the interpulse spacing.

This lower limit is consistent with the time required for the x-ray emitting plasma formed at the surface of the laser target to dissipate and thus to permit the unobstructed formation of a new, x-ray emitting plasma by a subsequent laser pulse. The formation of a hot plasma by a focussed laser pulse onto a solid surface is typically accompanied by the production of a small crater in the solid material. Subsequent laser pulses focussed into such a crater show increased x-ray production efficiency as described in U.S. Pat. application Ser. No. 669,440, filed Nov. 11, 1984.

In a pulse-pumped, flashlamp driven laser system such as neodymium, the overall optimum conversion of power supply electrical energy into stored laser energy occurs when the flashlamp current pulse has approximately the same duration as the characteristic laser energy storage time of the amplifying medium. This sets an upper limit on the interpulse spacing for best efficiency.

Figure 15:
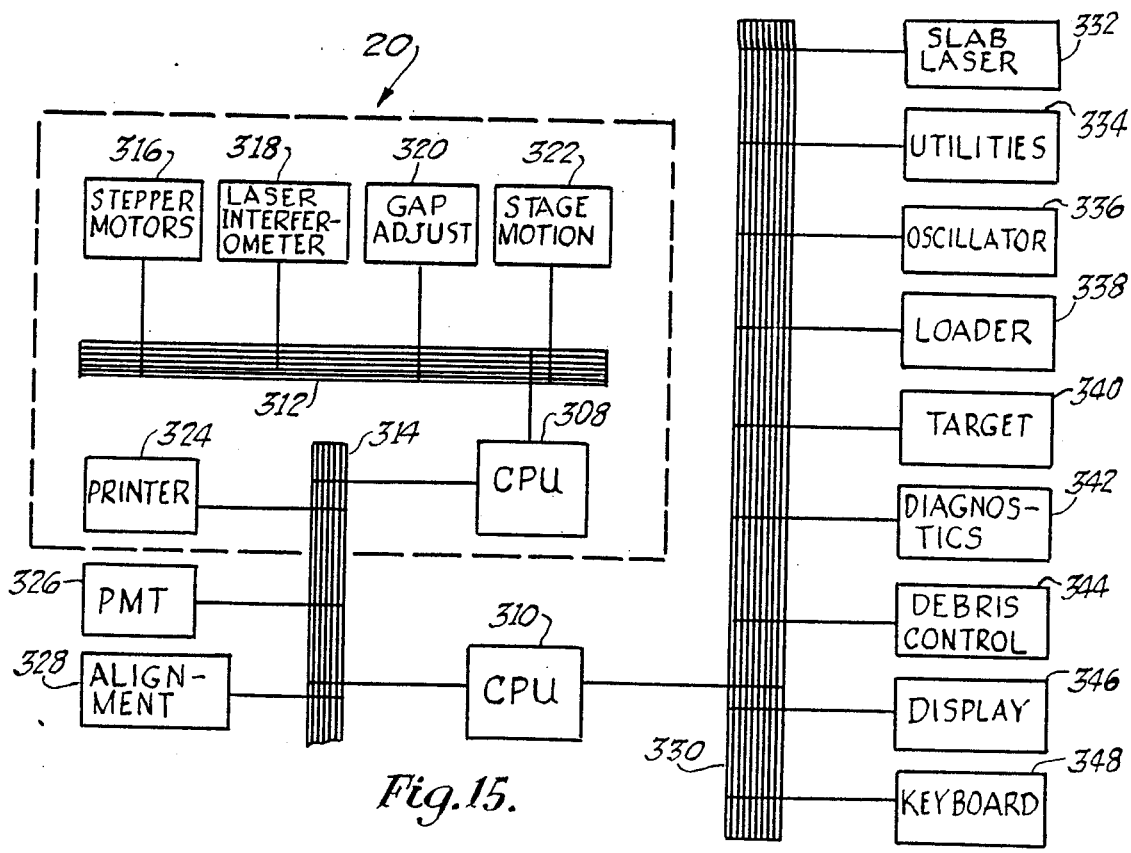
FIG. 15 is an overall block diagram of the electrical control system of the subject invention.
Figure 16A:
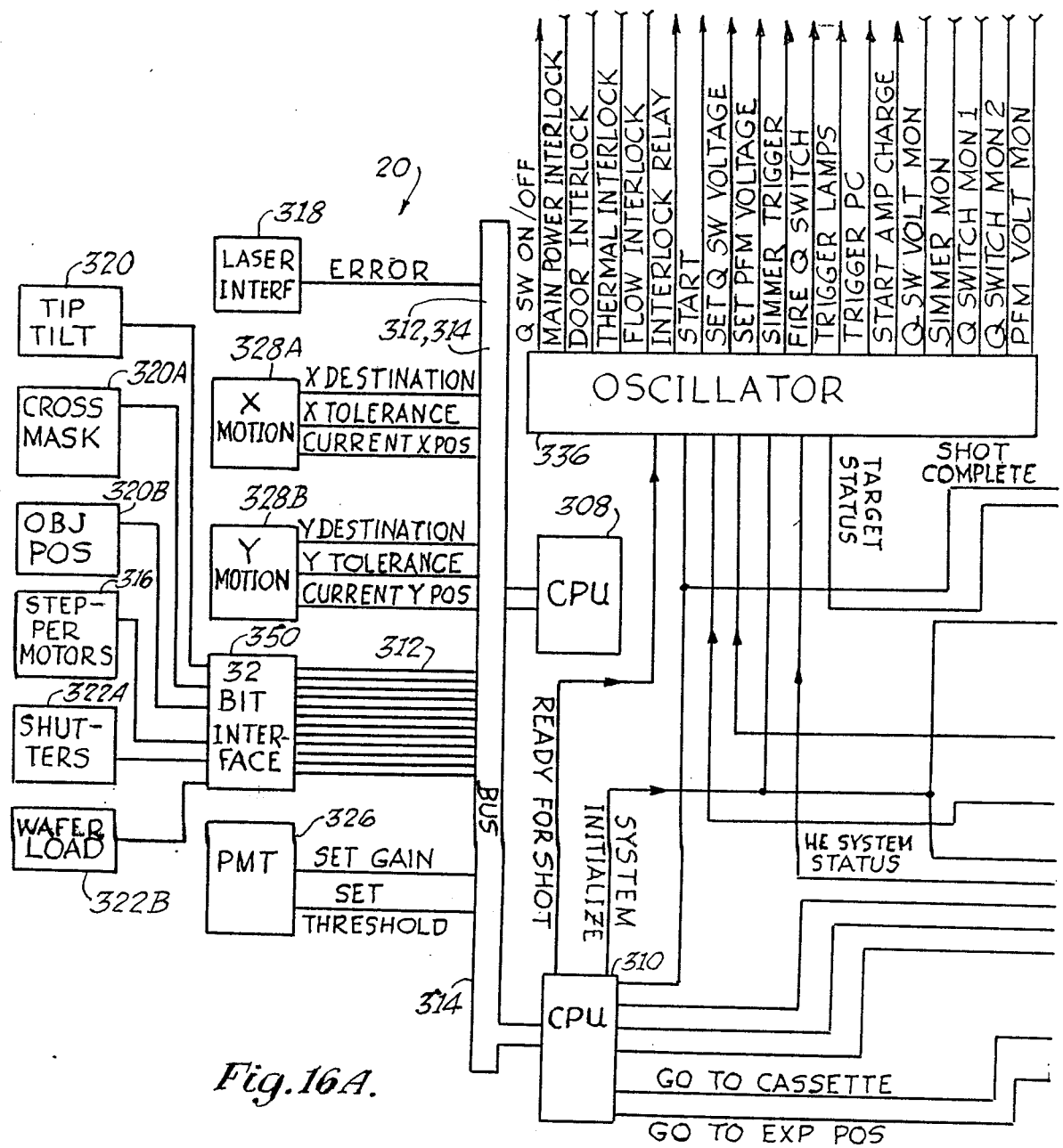
FIGS. 16A and 16B are placed together.
Figure 16:
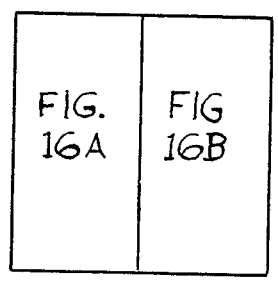
Figure 16B:
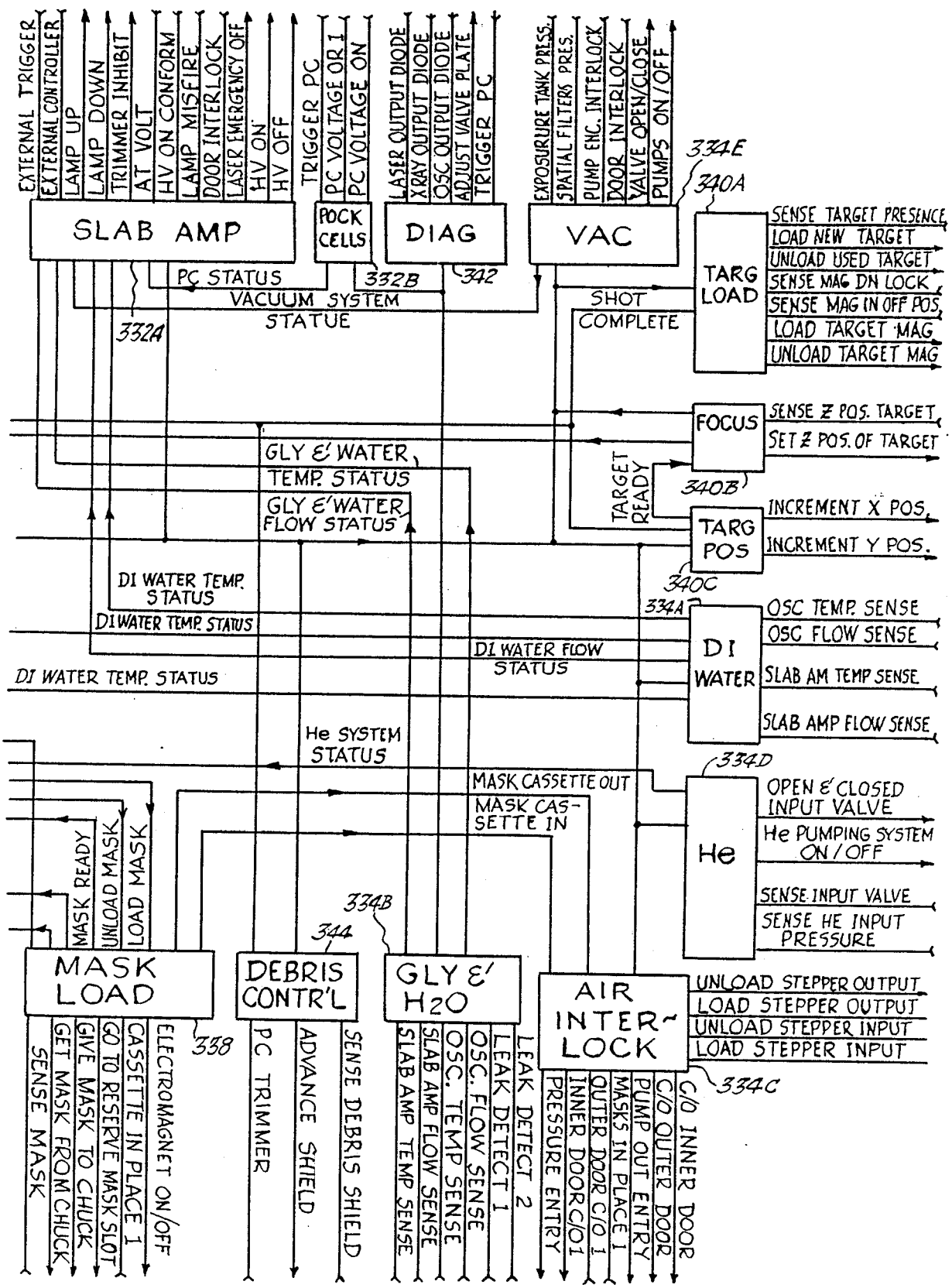

Referring now to FIGS. 15 and 16A and 16B, as connected as shown in FIG. 16, the control system 20 of the subject invention will now be described. The heart of control system 20 is a pair of central processing units (CPU) 308 and 310. CPU 308 may be an HP 300 minicomputer manufactured by Hewlett Packard of Palo Alto Calif. and generally is used to control the wafer handling system 18. CPU 310 may be an 8088 type microprocessor manufactured by Zendex or equivalent and generally controls the remaining apparatus and timing within the system. CPU 308 is connected to a pair of buses 312 and 314. Bus 312 interconnects CPU 308 with various portions of wafer handling system 18, such as the stepper motors 316, laser interferometer 318, gap adjust mechanisms 320 and stage motion mechanisms 322. Bus 314 connects CPU 308 and CPU 310 so that they may communicate with each other. Further, a printer 324, photo multiplier tube (PMT) 326 and alignment mechanisms 328 are connected to bus 314.

CPU 310 is further connected to a bus 330 to which a plurality of different components receive commands from or provide information to CPU 310. These include slab laser 332, utilities 334, oscillator 336, loader 338, target 340, diagnostics 342, debris control 344, displays 346 and keyboard 348.

Referring now to FIGS. 16A and 16B, a more detailed diagram of the control system 20 of FIG. 15 is shown. It should be noted that FIGS. 16A and 16B should be placed together in the manner shown in FIG. 16. In FIG. 16A, the busses 312 and 314 of FIG. 15 have been combined into a single bus 314, from which bus 312 exits.

CPU 308 is coupled to bus 314 to provide various signals to both CPU 310 and the various blocks to the left of bus 314. These blocks include the laser interferometer 318, which provides wafer position and error signal back to bus 314. The alignment circuitry 328 is shown as an X motion alignment system 328A and a Y motion alignment system 328B, each of which receives destination and tolerance signals and provides a current position signal. Finally, the PMT system responds to the set gain and set threshold signals applied thereto from CPU 308 over bus 314.

Bus 312 couples bus 314 to a 32 bit interface circuit 350, which provides timing signals to the gap adjust circuits, shown as tip tilt 320C, cross mask 320A and object positioner 320B. In addition, timing signals are provided to the stepper motors 316, the shutter 322A, and the wafer load 322B, the latter two of which form a part of the stage motion device, shown in FIG. 15.

CPU 310 responds to signals from CPU 308, as well as provides signals thereto, over bus 314. In addition, CPU 310 provides a Ready For Shot signal to oscillator 336 and responds to a Shot Complete signal from oscillator 336. Oscillator 336 may be the electronics associated with laser oscillator 172. In addition, CPU 310 provides the Load Mask and Unload Mask signals to Mask Load circuit 338 and responds to the Mask Ready signal from circuit 338. Lastly, CPU 310 responds to the Go To Cassette and Go To Exp Pos signals from Mask Load circuit 338.

CPU 310 provides a System Initialized signal to each of the various circuits 336, 338, 332A, 344, 332B, 342, 334B, 334E, 340A, 340B, 340C, 334A, 334D, 334B and 334C within system 20. Upon the occurrence of the System Initialized signal, each of the circuits is initialized to perform its intended function. The System Initialized signal is provided during the Initialization of system 10 described hereafter with respect to FIG. 17A and 17B.

Oscillator 336 responds to the Ready For Shot signal from CPU 310 and various status signals, such as the Distilled Water Temperature status signal from DI Water circuit 334A, the Helium status signal from Helium circuit 334D and the Target Status signal from Focus circuit 340B. Assuming all of the status signals are proper, Oscillator circuit 336, in response to the Ready For Shot signal, causes the laser pulse train, previously explained, to be provided and issues the Shot Complete signal to CPU 310. In addition, the Shot Complete signal is provided to the Debris Control circuit 334, the Target Position circuit 340C and the Target Load circuit 340A. In order to control the provision of the laser pulse beams 24 and 24A, Oscillator circuit 336 responds to and provides a plurality of signals within the system. The signals provided by the Oscillator circuit 336 include the Q-Switch On/Off signal, the Interlock Relay signal, the Start signal, the Set Q Switch voltage, the Set PFN voltage, the Simmer Trigger signal, the Fire Q Switch Voltage signal, the Trigger Lamps signal, the Trigger Pockels Cell signal and the Start Amplifier Charge signal. Oscillator 336 responds to the Main Power Interlock signal, Door Interlock Signal, Thermal Interlock signal, the Flow Interlock signal, the Q-Switch Voltage Monitor signal, the Simmer Monitor signal, the Q Switch Monitor 1 and Q-Switch Monitor 2 signals and the PFM Voltage Monitor signal.

Referring now to FIG. 16B, the slab amplifier circuit 332A responds to the Glycol and Water Flow Status and Glycol and Water Temperature Status signals, as well as the Vacuum System Status, DI Water Flow Status and DI Water Temperature Status signals and Pockels Cell Status signal from Pockels cell circuit 332B. The slab amp circuit 332A further responds to external signals, including the External Trigger signal and the External Controller Voltage signal. Other information provided the slab amp circuit 332A includes the AT Volt signal, the HV Down Confirmation signal, the Lamp Misfire signal, and the Door Interlock signal. Slab amp 332A provides control signals to turn on the flash lamps of amplifier 188 shown in FIG. 11, including the Ramp Up and Ramp Down signals, the Trigger Inhibit signal and the Laser Energy Off signal. In addition, the HV On and HV Off signals are provided from slab amplifier circuit 332A.

Pockels cell circuit 332B responds to the System Initialized signal from CPU 310 and provides the Pockels Cell Status signal to slab amplifier circuit 332A, in response to the Trigger Pockels Cell signal provided thereto from oscillator circuit 336. In addition, Pockels cell circuit 332B receives the Pockels Cell Voltage Down and Pockels Cell OK signals from circuits associated with the Pockels Cells 216 and 252, shown in FIG. 11.

The Diagnostic circuit 342 responds to the System Initialized signal, the Laser Output Diode, X-ray Output Diode, Oscillator Output Diode, and Trigger PC signals and provides the Adjust Wave Plate signal.

The Vacuum Control circuit 334E responds to the Systems Initialized signal and the Exposure Tank Pressure, Spatial Filter Pressure, Pump Enclosure Interlock and the Door Interlock signals and provides the Vacuum System Status signal to Slab Amplifier circuit 332A. In addition, Vacuum Control circuit 334E provides the Valve Open/Closed signal and the Pumps On/Off signals.

Target Load circuit 340A responds to the System Initialized signal and the Shot Complete signal from Oscillator 336. In addition, Target Load circuit 340A responds to the Sense Target Presence signal, the Sense Magazine Down Loader signal, the Sense Magazine In Up Position signal and provides the Load New Target signal, Unload Used Target signal, Load Target Magazine signal and Unload Target Magazine signal.

Focus circuit 340B responds to the System Initialized signal from computer 310 and the Target Ready Signal from Target Position Circuit 340C. In addition, Focus circuit 340B responds to the Sense Z Position Target signal and provides the Sense Z Position Of Target signal and the Target Status signal.

Target Position circuit 340C responds to the System Initiate signal and the Shot Complete signal and provides the Increment X Position and Increment Y Position signals to the target mechanisms.

DI Water circuit 334A responds to the System Initialized signal and the Oscillator Temperature Sense Signal, Oscillator Flow Sensor signal, Slab Amplifier Temperature Sensor signal and Slab Amplifier Flow Sensor signal. Distilled water control circuit 334A provides the DI Water Temperature Status signals and DI Water Flow status signals previously described.

Helium Control circuit 334D responds to the System Initialized signal and the Sense Input Valve and the Sense Helium output pressure signals. Helium control circuit 334D provides the Helium System Status signal to oscillator 336 and the Open/Closed Input Valve signal and the Helium Pumping System On/Off signals to control the helium pressure.

Air Interlock control circuit 334C responds to the System Initialized signal, the Mask Cassette Out signal and the Mask Cassette In signal, the Mask In Place signal and the Outer Door Closed/Open Status signal. Air Interlock control circuit 334C provides the Unload Stepper Output, Load Stepper Output, Unload Stepper Input and Load Stepper Input control signals. In addition, Air Interlock control circuit 334C provides the Closed/Open Interdoor, Closed/Open Outer Door, Pump Out Entry, Inner Door Closed/Open and Pressurized Entry control signals.

Glycol and Water control circuit 334B responds to the Initialize System signal from CPU 310 and the Leak Detect 1, the Leak Detect 2, a pair of Oscillator Flow Sense signals and a pair of Slab Amplifier Flow Sense signals and provides the Glycol and Water Temperature Status and Glycol and Water Flow Status signals to slab amplifier control circuit 332A.

Debris Control circuit 344 responds to the System Initialized signal and the Shot Complete signal as well as the Sense Debris Shield and Pockels Cell Trigger signal to provide an Advanced Shield signal to move the membrane shield 77 over the target to stop the dust particle debris.

Mask Load Control circuit 338B responds to the System Initialized signal and the Unload Mask and Load Mask signals from CPU 310. In addition, Mask Load Control circuit 338B responds to the Cassette Down Place 1 signal and the Sense Mask signal provided thereto from the mask moving mechanisms. Mask Load control circuit 338B provides the Go To Cassette and Go To Exp. Position signals to CPU 310 and additionally provides the Electromagnet On/Off signal to Go To Mask Slot signal, the Give Mask To Chuck signal and the Get Mask From Chuck signal.

As can be appreciated when viewing FIGS. 16A and 16B together, the control of the system is accomplished by computer 310 and the program therein which provides certain signals at certain times to cause certain events to happen. Other things, once initiated, occur automatically in sequence based on each of the various control circuits communicating with one another or with certain transducers throughout system 10.

Figure 17A:
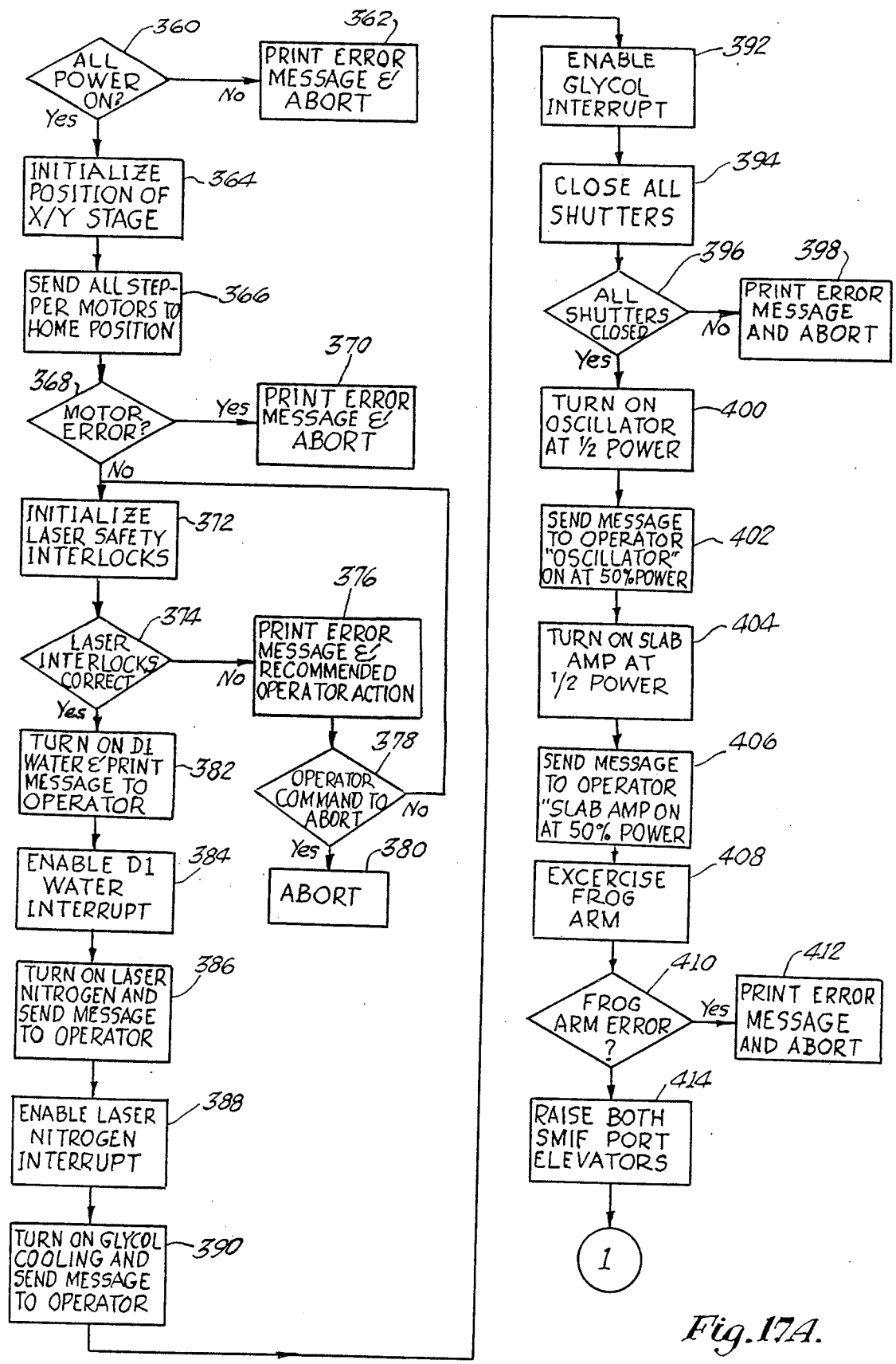
FIGS. 17A and 17B show a flow diagram of the initiation procedure prior to utilizing the subject invention in production.
Figure 17B:
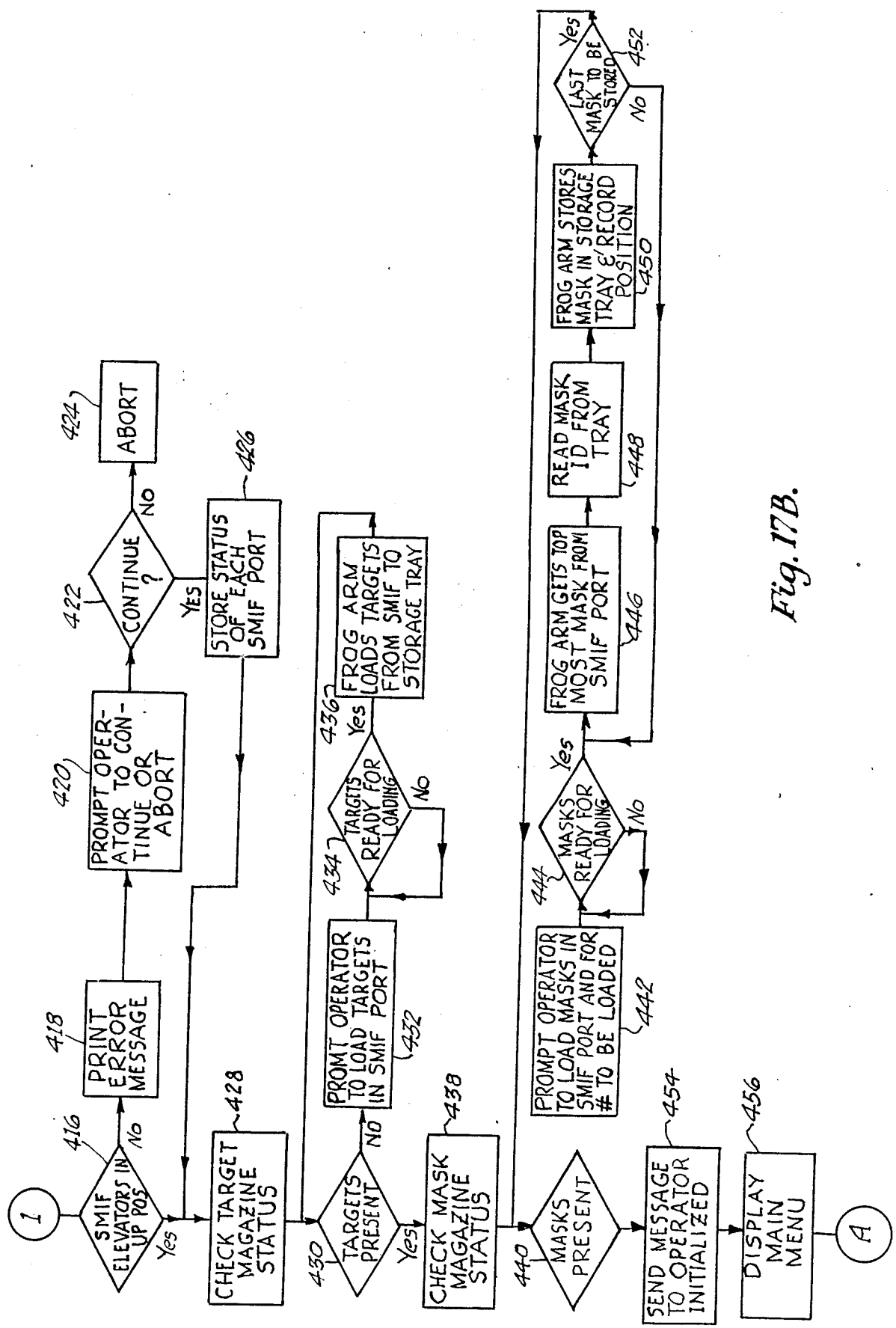

Examples of the program control caused by CPU 310 on the overall system are shown in FIGS. 17A, 17B, 18, 19, 20 and 21. Referring now to FIG. 17A and 17B, the Initialize Program will be described. This program is executed whenever power is initially applied to the system.

First, according to block 360, a determination is made as to whether all power has been turned on. If the answer is no, then according to block 362, an error message is printed indicating that power is not applied and the program aborts. Assuming that at block 360 power was determined to be on, then according to block 364, the position of the xy stage, which is the chuck 60 of wafer handling system 18, is digitized.

Next, according to block 366, all stepper motors are returned to the home position and the determination is made, as indicated at block 368, whether there are any motor errors. If so, the error message is printed and the program aborts. Assuming no motor errors, then, according to block 372, the laser safety interlocks are digitized and, according to block 374, a determination is made whether the digitized laser interlocks are correct. If not, then according to block 376, the printer prints an error message and recommended operator action. Next, according to block 378, a determination is made whether the operator has commanded abort. If so, then according to block 380, the abort action occurs. If at block 378 the operator had taken the recommended corrective action, a return to block 372 occurs and the laser interlocks are redigitized and, as indicated at block 374, rechecked.

Once the interlocks are determined to be correct at block 374, then according to block 382, distilled water is turned on and a message is printed so indicating to the operator. Next, according to block 384, the distilled water interrupt is enabled and according to block 386 the laser nitrogen is turned on and the message is printed to notify the operator of such action. Next, according to block 388, the laser nitrogen interrupt is enabled.

Next, according to block 390, the glycol cooling is turned on and a message is sent so indicating to the operator. Then, according to block 392, the glycol interrupt is enabled and according to block 394, all shutters are closed. Thereafter, as indicated at block 396, a determination is made whether all shutters have been closed. If not, according to block 398, an error message is printed and an abort occurs. Assuming the shutters were determined to be closed at block 396, then, as indicated at block 400, the laser oscillator is turned on at one-half power and according to block 402 a message so indicating is sent to the operator. Next, according to block 404, the slab amplifier is turned on at one-half power, and according to block 406, a message so indicating is sent to the operator.

Next, according to block 408, the frog arm is exercised. The term "frog arm" is the name given to the material handling system 14 robot 28 and arm 30, shown in FIG. 1A. As previously mentioned, the arm 30 of robot 28 moves the masks, target and wafers within system 10. Next, according to block 410, a determination is made whether there are any frog arm errors, and, if so, the error message is printed and an abort occurs.

Assuming that the frog arm is properly operating, as determined at block 410, then according to block 414, the two SMIF port elevators are raised. The SMIF port is the port which container 34 shown in FIG. 1 is inserted and includes an elevator therein for moving the items present in the port to a position to be loaded onto the frog arm. Continuing at block 416 in FIG. 17B, next, a determination is made whether the SMIF elevators are in the up position. If not, according to block 418, an error message is printed and according to block 420, the operator is prompted to continue or to abort. If at block 422 it is determined that the operator determined to abort, then block 424 indicates the abort. If at block 422 it were determined that the operator desired to continue, then according to block 426 the status of each of the SMIF ports is stored and then a continuation at block 428 occurs. At block 428 the target magazine status is checked and next at block 430 a determination is made whether targets are present. If it is found at block 430 that no targets were present, then according to block 432 the operator is prompted to load targets into one SMIF port. Next, at block 434, a determination is made whether the targets are ready for loading. If not, a return to the beginning of block 434 occurs until such time as it is determined that targets are ready for loading. Once targets are ready for loading, then according to block 436, the frog arm loads the targets from the SMIF port to the storage tray and a return to block 430 occurs. At this point it is determined that the targets are present.

Continuing with block 438, the mask magazine status is checked and, at block 430, a determination is made whether masks are present. If no masks are present, then according to block 442, the operator is prompted to load the masks in the SMIF port. In addition, the message will inform the operator how many masks are to be loaded and, then at block 444, a determination is made whether the masks are ready for loading into the system. Until such time as they are, the procedure remains at block 444. Once the masks are ready for loading into the system, then according to block 446, the frog arm is instructed to get the top most mask from the SMIF port. Next, according to block 448, the mask ID is read from the tray and, according to block 450, the frog arm stores the mask in the storage tray and records the position with respect to the ID read. Next, according to block 452, a determination is made whether the last mask has been stored. If not, a return to block 446 occurs and blocks 446, 448, 450 and 452 are repeated until the last mask has been stored in the storage tray and its position recorded in connection with the mask ID number. Once the last mask has been stored, then a return to block 440 occurs.

Once it is determined at block 440 that the masks are present, then, according to block 452, the operator is sent a message that the system has been initialized and according to block 456 the main menu is displayed. The initialization program then continues at point A as the main operating program, which is shown in FIG. 18.

Referring now to FIG. 18, the main system operating flow diagram will be described. This diagram is used in conjunction with the displayed main menu and has been labeled as program A for convenience herein. Generally, program A, or the system operating program, is continually repeated until the operator makes a selection from the main menu, in which case a branch to one of the other programs B through L occurs. When that selected program has been executed, a return to program A occurs and the program waits for the next operator command.

First, according to block 458, the user interface is initiated and according to block 460 the screens are cleared. Then, according to block 462, the user menu is displayed. Next, according to block 464, a determination is made whether a function request has been entered pursuant to the user menu. If not, all of the error conditions are checked, according to block 466, and if an error has been reported, as determined at block 468, the error condition is printed and an abort occurs. If no error had been reported at the determination made at block 468, a return to block 464 occurs and a wait for a function request or an error report occurs.

Once a function request has been found at block 464 a continuation with blocks 472-492 (even numbers only) occurs. Each of the blocks 472-492 (even numbers only) represents each of the various functions which can be requested. Whenever one of the functions has been determined to be found at one of blocks 472-492 (even numbers only), then a branch to a respective program B through L occurs.

The following functions correspond to the following programs which can be selected according to blocks 472-492 (even numbers only):

| Block No. | Function | Program |
| --- | --- | --- |
| 472 | Load Machine Data | B |
| 474 | Load Target | C |
| 476 | Load Mask Into Machine | D |
| 478 | Load Mask | E |
| 480 | Process Wafer | F |
| 482 | Print Data | G |
| 484 | Change Data | H |
| 486 | Read Status | I |
| 488 | Change Status | J |
| 490 | Diagnostics | K |
| 492 | Exit Menu | L |

Figure 20:
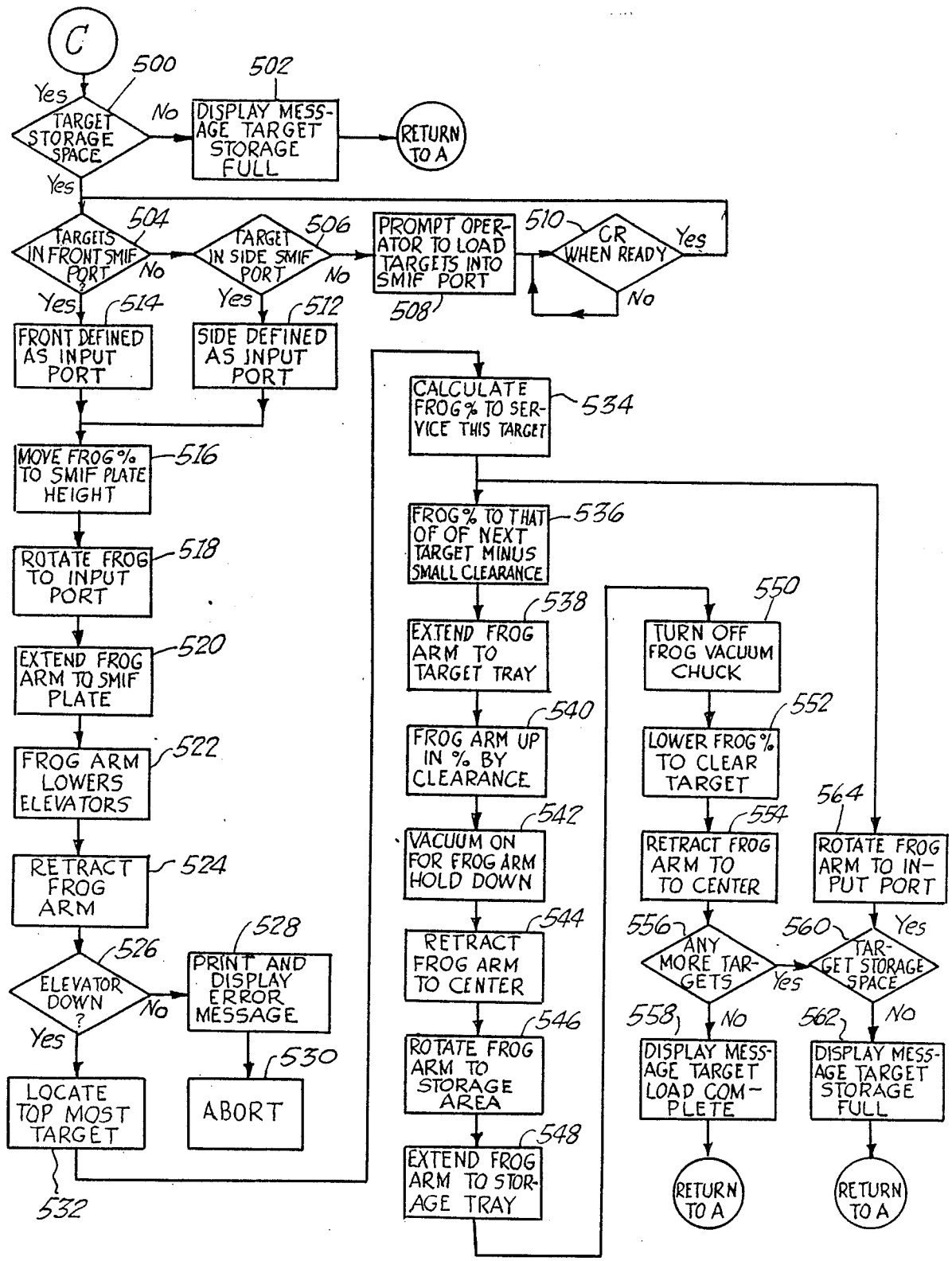
FIG. 20 shows a flow diagram of the manner in which the target may be loaded into the machine of the subject invention.
Figure 21:
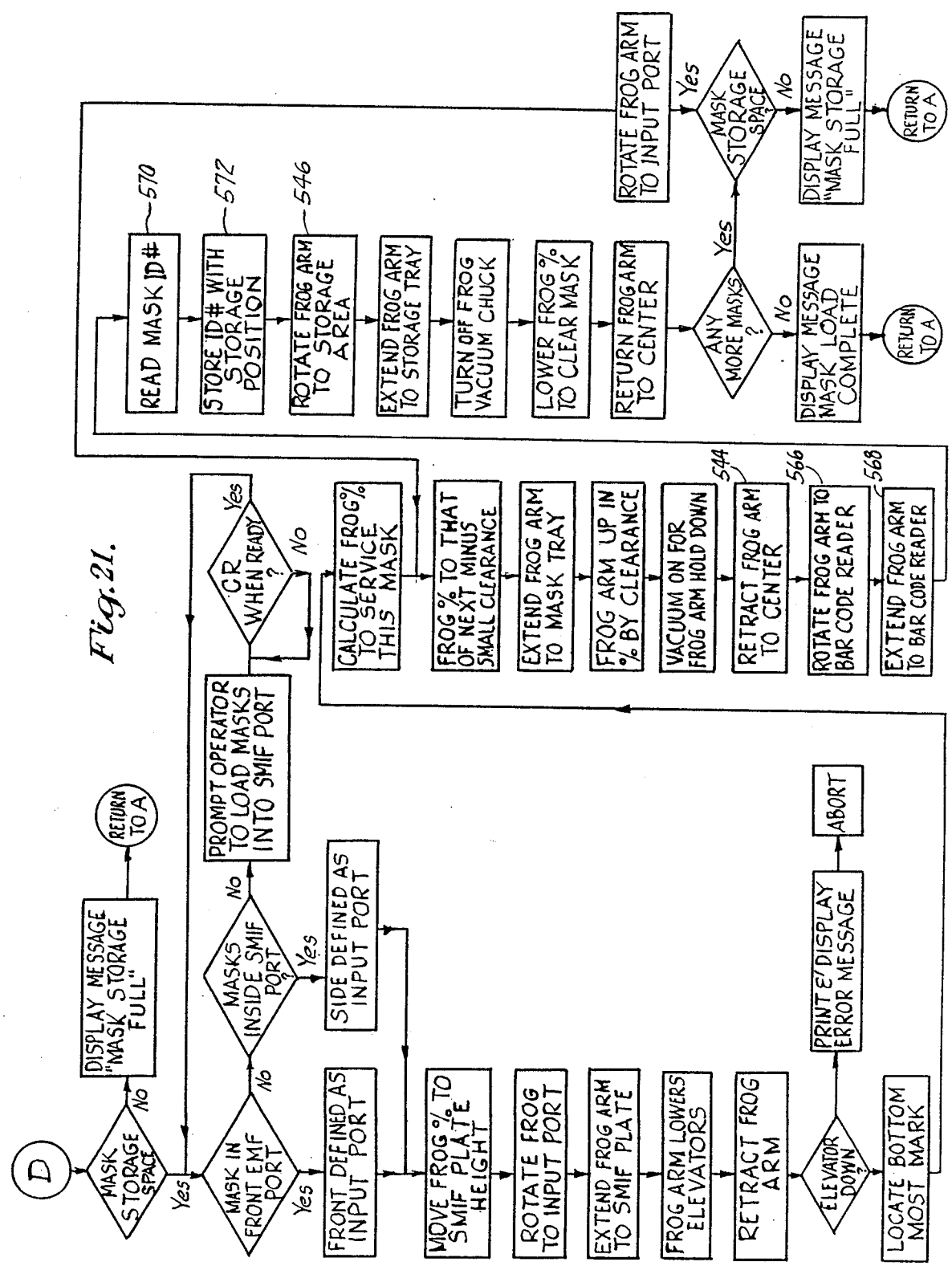
FIG. 21 shows the manner in which the masks may be loaded into the machine of the subject invention.

Examples of programs B, C and D, representing respectively, the Load Machine Data, Load Target and Load Masks Into Machine programs, are hereafter given in FIGS. 19, 20 and 21. Others of the programs can be developed, along the lines shown in FIGS. 19, 20 and 21 and the accompanying descriptions thereto, for the programs E-L.

Referring now to FIG. 19 the Load Machine Data program B is shown. First, according to block 494, the machine data is loaded from the file on the disk associated with computer 310. Next, according to block 496, the machine variables are updated based on information determined during the error and status checks. Lastly, according to block 498, the current machine operating variables are displayed and printed for the operator's benefit. Then a return to program A shown in FIG. 18 occurs.

Referring now to FIG. 20, program C, relating to the loading of the targets is shown. First, according to block 500, a determination is made whether target storage space exists. If not, the message "Target Storage Full" is displayed and a return to the main program A occurs.

Assuming at block 500 that target storage space was determined to exist, then, next, according to block 504, a determination is made whether there are targets in the front SMIF port. If not, a determination is made at block 506 whether there are targets in the side SMIF port. If both determinations at blocks 504 and 506 were no, then, according to block 508, the operator is prompted to load targets into one SMIF port and, according to block 510, a determination is made if the targets are ready. If not, a continuation with block 510 results until such time as it is determined that the ready condition exists. At that point, a clear signal is issued and a return to block 504 occurs. If at block 506, it were determined that the targets were in the side SMIF port, then according to block 512 the side SMIF port is defined as the input port. If at block 504, it were determined that the targets were in the front SMIF port, then according to block 514, the front SMIF port is defined as the input port.

In either case, a continuation at block 516 occurs and the frog arm is commanded to move in the Z, or vertical, direction to the SMIF plate height. Next, at block 518, the frog arm is commanded to rotate to the designated input port defined at block 512 or 514. Then, at block 520, the frog arm is extended to reach the SMIF plate at the designated input port and, at block 522, the frog arm lowers the elevator. Next, at block 524, the frog arm is retracted and, at block 526, a determination is made whether the elevator is down. If not, an error message is printed, as indicated at block 528, and abort occurs, as indicated at block 530. Assuming the determination was made at block 526 that the elevator was down, then according to block 532, the top most target is located. Next, according to block 534, the z distance required for the frog to move to service this target is calculated and at block 536, the frog arm is moved to that calculated height, minus a small clearance. Next, according to block 538, the frog arm is extended to the target tray and at block 540, the frog arm is moved up by the clearance amount.

Next, according to block 542, the vacuum is turned on for the frog arm hold down, so that it can take the target and, at block 544, the frog arm is retracted to the center. Then, at block 546, the frog arm is rotated to the storage area and, at block 548, the frog arm is extended to the storage tray. Then, at block 550, the vacuum chuck is turned off so that the target can be stored and, at block 552, the frog arm is lowered to clear the target and, at block 554, the frog arm is retracted back to the center to be out of the way.

Next, at block 556, a determination is made whether there are any more targets. If not, a message is displayed that the target load is complete and a return to the main program A occurs. If at block 556 it were determined that there were more targets to be loaded, then, at block 560, a determination is made whether there is target space available. If not, then according to block 562, the message "Target Storage Full" is displayed and a returned to the main program A occurs. If, at block 560, it were determined that there was additional storage space, then, at block 564, the frog arm is rotated back to the input port and a return to block 536 occurs and the same process beginning with block 536 is repeated until such time as a return to the main program, after either block 558 or block 562, results.

Referring now to FIG. 21, program D, relating to loading masks into the machine, is shown. Program D is identical to program C, with the exception that the operations occur with respect to masks instead of targets and with the further exception of the addition of blocks 566, 568, 570 and 572 between blocks 544 and 546. Block 566 indicates that the frog arm, which was retracted to the center at block 544, is rotated to the bar code reader and, then, according to block 568, the frog arm is extended to the bar code reader. Then, at block 570, the mask ID is read by the bar code reader and, at block 572, the ID is stored with respect to the storage position. Then, the program as previously described continues at block 546, where the frog arm is rotated to the storage area and the mask is stored.

What is claimed is:

1. In an x-ray lithography system in which a generated laser beam is to be directed to strike a target to cause an x-ray emitting plasma to be created and in which a resist covered wafer is placed in the path of said emitted x-rays, the improvement comprising:
 laser beam splitter means for splitting said generated laser beam into at least first and second laser beams, each of which has less energy than said generated laser beam; and
 first and second laser beam directing means for directing said respective first and second beams over two separate paths towards a common spot on said target, at which spot said plasma is created.

2. In an X-ray lithography system of type in which X-rays are provided through a chamber towards a resist covered wafer, said wafer being moved from exposure position to exposure position, there being fixed reference alignment marks within said chamber and corresponding alignment marks on each exposure portion of said wafer, the improvement of alignment means comprising:
 means for directing light into said chamber along a path intersecting said reference alignment marks and said wafer, said path being within a moveable member;
 means, responsive to the reflection of said light from said wafer surface back along a path within said moveable member, for a providing a signal manifesting a determination that said wafer alignment marks are in alignment with said reference alignment marks; and
 means for moving said moveable member from a first position blocking the X-ray path to a second position away from said X-ray path in response to said determination of alignment signal;

wherein said chamber is evacuated and said means for moving includes bellows means coupling said moveable member to said chamber and for maintaining the vacuum within said chamber during movement of said moveable number.

3. An X-ray lithography system comprising:

target means and resist covered wafer means, the resist covered surface of said wafer means having a plurality of sections thereon to be exposed by the application of X-rays provided at said target means;

an evacuated chamber having a window sealed in the side walls thereof, a first opening at one end of said chamber and a second opening at the other end of said chamber;

means for generating and focusing a laser beam through said window towards a focal point;

means external to said chamber for holding and moving said target means so that a target surface of said target means moves while containing said focal point aligned with said first opening, said target holding and moving means further forming a vacuum seal around said first opening while holding and moving said target means;

means external to said chamber for holding and moving said resist covered wafer means so one section at a time of said wafer means is aligned with said second opening, said wafer holding and moving means further forming a vacuum seal between said resist covered surface of said wafer means around said second opening while holding and moving said wafer means; and control means for controlling the generation of said laser beam, the evacuation of said chamber and the movement of said target holding and moving means and said wafer holding and moving means.

4. The invention according to claim 3 wherein said means for holding and moving said wafer means includes air bearing and vacuum sealing means.

5. The invention according to claim 4 wherein said means for holding and moving said target means includes air bearing and vacuum sealing means.

6. The invention according to claim 3 wherein said means for holding and moving said target means includes air bearing and vacuum sealing means.

7. The invention according to claim 3:
wherein said first opening is encompassed by a first flat surface;
wherein said means for holding and moving said target means includes a second flat surface, at least a portion of which is aligned with said first flat surface; and
wherein one of said first or second flat surfaces includes a flow path therethrough attached to pressure providing means for maintaining a separation between said first and second flat surfaces.

8. The invention according to claim 7 wherein one of said first or second flat surfaces includes a second flow path therethrough attached to evacuation means, said second flow path being positioned from said maintained separation at a location between said first flow path and said first opening.

9. The invention according to claim 8 wherein second flow path includes a ring recessed into said one surface.

10. The invention according to claim 9 wherein said recessed ring surrounds said first opening.

11. The invention according to claim 9 wherein said recessed ring surrounds said first opening during the movement of said target means.

12. The invention according to claim 3:
wherein said second opening is encompassed by a first flat surface;
wherein said means for holding and moving said wafer means includes a second flat surface, at least a portion of which is aligned with said first flat surface; and
wherein one of said first or second flat surfaces includes a flow path therethrough attached to pressure providing means for maintaining a separation between said first and second flat surfaces.

13. The invention according to claim 12 wherein one of said first or second flat surfaces includes a second flow path therethrough attached to evacuation means, said second flow path being positioned from said maintained separation at a location between said first flow path and said first opening.

14. The invention according to claim 13 wherein second flow path includes a ring recessed into said one surface.

15. The invention according to claim 14 wherein said recessed ring surrounds said first opening.

16. The invention according to claim 14 wherein said recessed ring surrounds said first opening during the movement of said wafer means.

17. The invention according to claim 13:
wherein said first opening is encompassed by a first flat surface;
wherein said means for holding and moving said target means includes a second flat surface, at least a portion of which is aligned with said first flat surface; and
wherein one of said first or second flat surfaces includes a flow path therethrough attached to pressure providing means for maintaining a separation between said first and second flat surfaces.

18. The invention according to claim 17 wherein one of said first or second flat surfaces includes a second flow path therethrough attached to evacuation means, said second flow path being positioned from said maintained separation at a location between said first flow path and said first opening.

19. The invention according to claim 18 wherein second flow path includes a ring recessed into said one surface.

20. The invention according to claim 19 wherein said recessed ring surrounds said first opening.

21. The invention according to claim 19 wherein said recessed ring surrounds said first opening during the movement of said target means.

22. A method of fabrication semiconductor devices using X-rays generated in the interior of an evacuated chamber by focusing a laser beam pulses on a held target with sufficient power to form an X-ray emitting plasma, said emitted X-rays exposing a pattern on a held resist covered semiconductor substrate, said chamber including first and second openings, said method comprising the steps of:

moving said target means and forming a vacuum seal with said target means around said first opening as a target surface of said target means moves over said first opening while containing the focal point of said focused laser beam; and moving said substrate and forming a vacuum seal with said substrate around said second opening as said substrate moves from one exposure position to the next adjacent exposure position.

23. The method according to claim 22 wherein said step of moving said target includes:
generating a high pressure zone between said chamber and means for holding said target; and
evacuating a region between said zone and said evacuated chamber interior.

24. The method according to claim 22 wherein said step of moving said target includes forming an air bearing and seal between said chamber and the means for holding said target.

25. The method according to claim 22 wherein said step of moving said substrate includes:
generating a high pressure zone between said chamber and means for holding said substrate; and
evacuating a region between said zone and said evacuated chamber interior.

26. The method according to claim 22 wherein said step of moving said substrate includes forming an air bearing and seal between said chamber and the means for holding said substrate.

27. A laser system comprising:
a laser amplifier system for receiving and storing optical energy, said optical energy being stored by said amplifier system for only a given time interval;
a Q-switched laser oscillator for supplying a plurality of separate laser pulses within said given time interval to said laser amplifier system;
a laser target system for multi-pulse X-ray production, including a metallic material capable of withstanding multiple, high intensity laser pulses; and
means for directing the separate amplified laser pulses from said amplifier system towards said laser target system.

28. The invention according to claim 27 wherein said laser amplifier includes a glass slab and light providing means for directing light into said glass prior to said separate laser pulses passing therethrough.

29. The invention according to claim 27 wherein said laser amplifier includes a glass slab and at least one flashlamp for directing said optical energy into said slab for storage therein, a portion of said energy being absorbed by said separate laser pulses being directed through said slab.

30. The invention according to claim 29:
wherein at least one of said means for directing includes a spatial filter; and
wherein the time between each separated laser pulse provided by said oscillator is greater than the time for any plasma formed within said spatial filter to dissipate.

31. The invention according to claim 30 wherein said means for directing said laser pulses through said amplifier system directs each of said laser pulses through said amplifier system a plurality of times.

32. The invention according to claim 31 wherein said means for directing said laser pulses from said amplifier system towards said target system directs each of said plurality of laser pulses to the same spot of said metallic material.

33. The invention according to claim 27:
wherein at least one of said means for directing includes a spatial filter; and
wherein the time between each separated laser pulse provided by said oscillator is greater than the time for any plasma formed within said spatial filter to dissipate.

34. The invention according to claim 33 wherein said target system metallic material remains stationary during said plurality of laser pulses.

35. The invention according to claim 34 wherein said means for directing said laser pulses through said amplifier system directs each of said laser pulses through said amplifier system a plurality of times.

36. The invention according to claim 33 wherein said means for directing said laser pulses through said amplifier system directs each of said laser pulses through said amplifier system a plurality of times.

37. The invention according to claim 27 wherein said means for directing said laser pulses through said amplifier system directs each of said laser pulses through said amplifier system a plurality of times.

38. The invention according to claim 27 wherein said means for directing said laser pulses from said amplifier system towards said target system directs each of said plurality of laser pulses to the same spot of said metallic material.

39. An X-ray lithography system comprising:
a resist covered substrate;
a mask having a pattern thereon;
a target aligned with said mask and substrate; and
laser beam pulse producing means, including oscillator means and amplifier means, for providing a plurality of amplified laser beam pluses to said target with sufficient power to cause an X-ray emitting plasma to be created, said X-rays being provided through said mask to cause a pattern of X-rays to expose said resist covered substrate;
said amplifier means including a glass slab and a flashlamp for providing optical energy to said slab for storage by said slab for only a given time period; and
said oscillator means generating a plurality of unamplified laser beam pulses within said given time period wherein said plurality of unamplified laser beam pulses are received by said amplifier means during said given time period.

40. The invention according to claim 39 wherein said laser beam pulse producing means further includes spatial filters through which each laser beam pulse travels and causes a plasma to be created, which plasma lasts for a certain time period, less than said given time period, each of said plurality of unamplified laser pulses being separated by at least said certain time period.

41. The invention according to claim 40 wherein said laser beam pulse producing means includes laser beam pulse directing means for directing each of said unamplified laser beam pulses through said amplifier a plurality of times during said given time period to obtain said amplified laser beam pulse.

42. The invention according to claim 39 wherein said laser beam pulse producing means includes laser beam pulse directing means for directing each of said unamplified laser beam pulses through said amplifier a plurality of times during said given time period to obtain said amplified lase beam pulse.

43. The invention according to claim 39 wherein each of said laser beam pulses are directed to the same point on said target.

44. The invention according to claim 39 wherein said laser oscillator is a Q switched laser oscillator.

45. The invention according to claim 39 wherein said glass slab has two parallel faces into which said optical energy from said flashlamps is directed and end faces positioned at an angle to said parallel faces, said unamplified laser beam pulses being directed into one of said end faces and said amplified laser beam pulses being provided from the other one of said end faces.

46. The invention according to claim 39 wherein each of said plurality of unamplified laser beam pulses are separated from the next occurring one of said laser beam pulses by at least 100 nanoseconds.

47. A method of providing amplified laser energy to an X-ray target so as to produce X-Rays said laser energy being amplified by a laser amplifier of a type which receives optical energy and stores said received optical energy for only a given time interval, said method comprising the steps of:
 directing optical energy towards said amplifier to energize said amplifier;
 generating a first laser beam pulse;
 providing said first laser beam pulse through said amplifier to produce a first amplified laser beam pulse;
 generating a second laser beam pulse and supplying said second laser beam pulse to said laser amplifier within said given time interval after the end of said step of directing;
 providing said second laser beam pulse through said amplifier to produce a second amplified laser beam pulse; and
 directing said first and second amplified laser pulses from said amplifier to said object.

48. The invention according to claim 47 wherein said object is a target of a type from which an X-ray emitting plasma may be created, said method further comprising the step of directing sufficient optical energy to said amplifier so that each of said first and second laser beam pulses have sufficient power to create an X-ray emitting plasma upon being directed to said target.

49. The method according to claim 48
 wherein said step of providing said first laser beam pulse includes providing said first laser beam through a spatial filter, so as to create a plasma in said first spatial filter during a certain time interval, said certain time interval being less than said given time interval; and
 wherein said step of generating said second laser beam pulse occurs after said certain time interval.

50. The method according to claim 47
 wherein said step of providing said first laser beam pulse includes providing said first laser beam pulse through a spatial filter, so as to create a plasma in said first spatial filter during a certain time interval, said certain time interval being less than said given time interval; and
 wherein said step of generating said second laser beam pulse occurs after said certain time interval.

51. The method according to claim 47
 wherein said object is a target; and
 wherein said step of directing includes
  directing said laser beam pulses towards said target,
  creating and X-ray emitting plasma at the point said laser beam pulses intersect said target,
  placing an patterned X-ray mask in the path of said X-rays, and
  exposing a resist covered substrate with a pattern of X-rays defined by said mask.

52. The method according to claim 51
 wherein said step of providing said first laser beam pulse includes providing said first laser beam pulse through a spatial filter, so as to create a plasma in said first spatial filter during a certain time interval, said certain time interval being less than said given time interval; and
 wherein said step of generating said second laser beam pulse occurs after said certain time interval.

53. The method according to claim 52 wherein said object is a target of a type from which an X-ray emitting plasma may be created, said method further comprising the step of directing sufficient optical energy to said amplifier so that each of said first and second laser beam pulses have sufficient power to create an X-ray emitting plasma upon being directed to said target.

* * * * *

UNITED STATES PATENT AND TRADEMARK OFFICE
CERTIFICATE OF CORRECTION

PATENT NO. : 4,969,169
DATED : November 6, 1990
INVENTOR(S) : James M. Forsyth et al It is certified that error appears in the above—identified patent and that said Letters Patent is hereby corrected as shown below:

The inventors listed on the cover sheet should include, in addition to James M. Forsyth, the following:
    Joseph A. Abate
    Thomas L. Duft
    Malcolm M. Drummond
    Lisa Gregorka
    John F. Hoose
    Robert G. Zambelli Signed and Sealed this Seventeenth Day of March, 1992

*Attest:*

HARRY F. MANBECK, JR.

*Attesting Officer*      *Commissioner of Patents and Trademarks*